(12) United States Patent
Amzaleg et al.

(10) Patent No.: US 10,957,567 B2
(45) Date of Patent: Mar. 23, 2021

(54) METHOD, COMPUTER PROGRAM PRODUCT AND SYSTEM FOR DETECTING MANUFACTURING PROCESS DEFECTS

(71) Applicant: Applied Materials Israel Ltd., Rehovot (IL)

(72) Inventors: Moshe Amzaleg, Beer Sheva (IL); Ofer Adan, Rehovot (IL)

(73) Assignee: Applied Materials Israel Ltd., Rehovot (IL)

( * ) Notice: Subject to any disclaimer, the term of this patent is extended or adjusted under 35 U.S.C. 154(b) by 0 days.

(21) Appl. No.: 16/683,145

(22) Filed: Nov. 13, 2019

(65) Prior Publication Data

US 2020/0118855 A1    Apr. 16, 2020

Related U.S. Application Data

(63) Continuation of application No. PCT/US2018/033023, filed on May 16, 2018.
(Continued)

(51) Int. Cl.
*H01L 21/67* (2006.01)
*G05B 19/406* (2006.01)
(Continued)

(52) U.S. Cl.
CPC ... *H01L 21/67288* (2013.01); *G01N 21/9503* (2013.01); *G05B 19/406* (2013.01); *G06T 7/0004* (2013.01); *G06T 7/60* (2013.01); *H01L 21/0335* (2013.01); *H01L 21/0337* (2013.01); *H01L 21/0338* (2013.01); *H01L 21/31116* (2013.01); *H01L 21/67069* (2013.01);
(Continued)

(58) Field of Classification Search
None
See application file for complete search history.

(56) References Cited

U.S. PATENT DOCUMENTS 6,452,677 B1    9/2002  Do et al.
2002/0135781 A1    9/2002  Singh et al.
(Continued)

FOREIGN PATENT DOCUMENTS

WO    2014/081899 A1    5/2014

OTHER PUBLICATIONS

International Preliminary Report on Patentability for Application No. PCT/US2018/033023, dated Nov. 28, 2019, 12 pages.
(Continued)

*Primary Examiner* — Evren Seven
(74) *Attorney, Agent, or Firm* — Kilpatrick Townsend & Stockton LLP

(57) ABSTRACT

A system, computer program product and a method for detecting manufacturing process defects, the method may include: obtaining multiple edge measurements of one or more structural elements after a completion of each one of multiple manufacturing phases; generating spatial spectrums, based on the multiple edge measurements, for each one of the multiple manufacturing phases; determining relationships between bands of the spatial spectrums; and identifying at least one of the manufacturing process defects based on the relationships between the bands of the spatial spectrums.

13 Claims, 30 Drawing Sheets

Related U.S. Application Data

(60) Provisional application No. 62/507,711, filed on May 17, 2017.

(51) Int. Cl.

| | |
|---|---|
| *G06T 7/00* | (2017.01) |
| *G06T 7/60* | (2017.01) |
| *H01L 21/033* | (2006.01) |
| *H01L 21/311* | (2006.01) |
| *H01L 21/66* | (2006.01) |
| *G01N 21/95* | (2006.01) |
| *G01B 15/08* | (2006.01) |

(52) U.S. Cl.
CPC .............. *H01L 22/12* (2013.01); *G01B 15/08* (2013.01); *G05B 2219/32179* (2013.01); *G06T 2207/30148* (2013.01)

(56) References Cited

U.S. PATENT DOCUMENTS

| | | | | |
|---|---|---|---|---|
| 2005/0013474 | A1* | 1/2005 | Sim | G01N 21/9503 382/145 |
| 2005/0139767 | A1 | 6/2005 | Pinto et al. | |
| 2008/0013822 | A1* | 1/2008 | Pai | G01N 21/9501 382/145 |
| 2008/0267489 | A1 | 10/2008 | Xiao et al. | |
| 2009/0130784 | A1* | 5/2009 | Michelsson | G06T 7/0004 438/14 |
| 2013/0122265 | A1* | 5/2013 | Miyamoto | B24B 49/12 428/192 |
| 2015/0243018 | A1* | 8/2015 | Vajaria | G06T 7/62 382/133 |
| 2016/0254199 | A1* | 9/2016 | Chin | H01L 22/14 356/237.5 |
| 2017/0003120 | A1* | 1/2017 | Bean | G01B 9/02032 |
| 2019/0304851 | A1* | 10/2019 | Smith | G01N 21/9501 |

OTHER PUBLICATIONS

International Search Report and Written Opinion for Application No. PCT/US2018/033023, dated Sep. 17, 2018, 16 pages.

* cited by examiner

METHOD, COMPUTER PROGRAM PRODUCT AND SYSTEM FOR DETECTING MANUFACTURING PROCESS DEFECTS

CROSS REFERENCE TO RELATED APPLICATIONS

This application is a continuation of International Patent Application No. PCT/US2018/033023, filed May 16, 2018, which claims the benefit of and priority to U.S. Provisional Patent Application No. 62/507,711, filed May 17, 2017, the entire contents of both of which are incorporated herein by reference for all purposes.

BACKGROUND

There is a growing need to improve nanometric metrology methods and processes.

BRIEF DESCRIPTION OF THE DRAWINGS

The subject matter regarded as the invention is particularly pointed out and distinctly claimed in the concluding portion of the specification. The invention, however, both as to organization and method of operation, together with specimens, features, and advantages thereof, may best be understood by reference to the following detailed description when read with the accompanying drawings in which:

Figure 1:
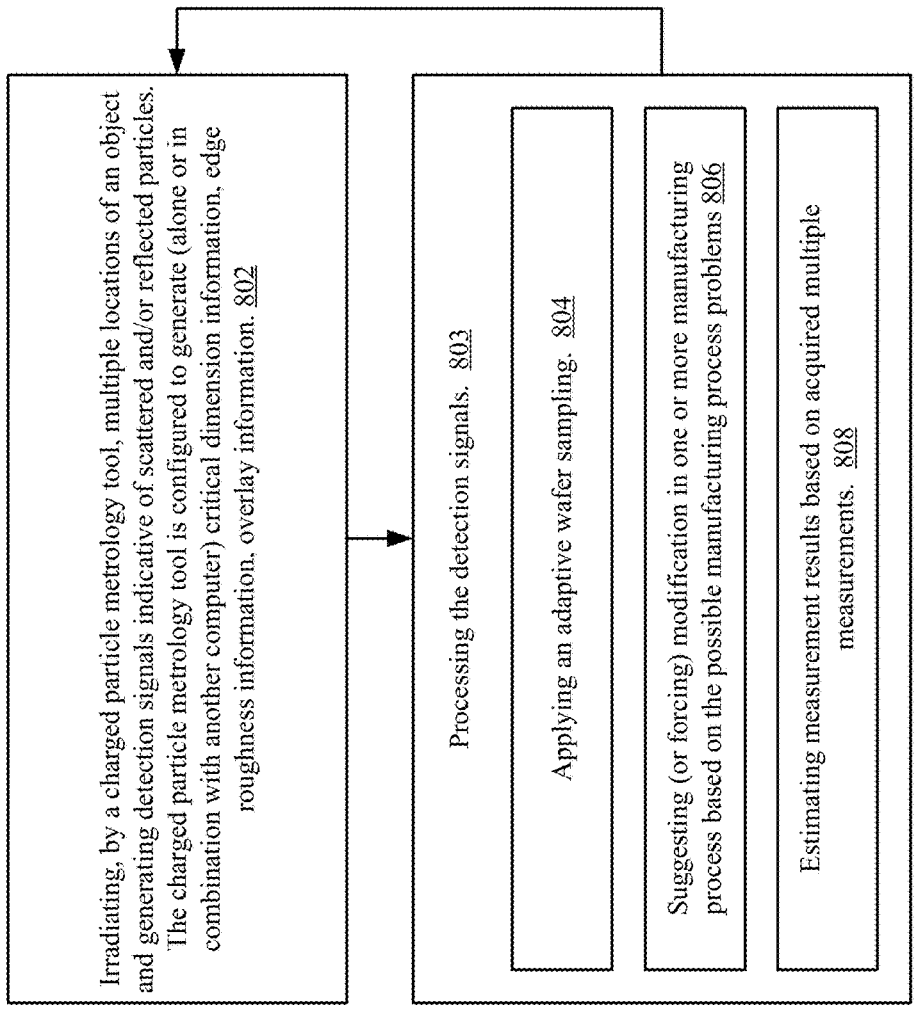
FIG. 1 illustrates an example of a method.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method, and should be applied mutatis mutandis to a computer program product that stores instructions that once executed result in the execution of the method.

Any reference in the specification to a system should be applied mutatis mutandis to a method that may be executed by the system should be applied mutatis mutandis to a computer program product that stores instructions that can be executed by the system.

Any reference in the specification to a computer program product should be applied mutatis mutandis to a method that may be executed when executing instructions stored in the computer program product and should be applied mutandis to a system that is configured to executing instructions stored in the computer program product.

The computer program product may be (or may include) a non-transitory computer readable medium that stores instructions that are readable by a computer.

The phrase "and/or" means additionally or alternatively.

There may be provided a method for detecting manufacturing process defects. The method may include (a) obtaining multiple edge measurements of one or more structural elements after a completion of each one out of multiple manufacturing phases (or during the multiple manufacturing phases); (b) generating spatial spectrums, based on the multiple edge measurements, for each one of the multiple manufacturing phases; (c) determining relationships between bands of the spatial spectrums; and (d) searching for at least one of the manufacturing process defects based on the relationships between the bands of the spatial spectrums.

The structural elements may be of nanometric dimensions.

The determining of the relationships between bands of the spatial spectrums may include determining the relationships between one or more bands of one spatial spectrum and one or more bands of another spatial spectrum.

A band of a spatial spectrum means a part (or segment or portion) of a spatial spectrum that is within a band.

The obtaining of the multiple edge measurements may include irradiating, by a charged particle metrology tool, edges of the one or more structural elements.

The obtaining of the multiple edge measurements may include obtaining tilted images of the one or more structural elements.

The obtaining of the multiple edge measurements may include obtaining bottom edge measurements and, additionally or alternatively, top edge measurements.

The method may include virtually segmenting each of the spatial spectrums to multiple bands.

The method may include forcing a modification of one or more manufacturing process parameters when finding the at least one of the manufacturing process defects.

The method may include requesting a modification of one or more manufacturing process parameters when finding the at least one of the manufacturing process defects.

The method may include receiving or generating one or more reference spatial spectrums, and determining at least one relationship between the one or more bands of the spatial spectrums and one or more bands of the reference spatial spectrum.

The one or more structural elements may include a mandrel, a spacer, spacer elements and intermediate layer elements that may be formed by applying an etch process on the spacer elements.

There may be provided a computer program product that stores instructions for obtaining multiple edge measurements of one or more structural elements after a completion of each one out of multiple manufacturing phases; generating spatial spectrums, based on the multiple edge measurements, for each one of the multiple manufacturing phases; determining relationships between bands of the spatial spectrums; and searching for at least one manufacturing process defect based on the relationships between the bands of the spatial spectrums.

The computer program product may store instructions for virtually segmenting each of the spatial spectrums to multiple bands.

The computer program product may store instructions for forcing a modification of one or more manufacturing process parameters when finding the at least one of the manufacturing process defects.

The computer program product may store instructions for receiving or generating one or more reference spatial spectrums, and determining at least one relationship between the bands of the spatial spectrums and one or more band of the one or more reference spatial spectrums.

There may be provided a system that may include a processor and a memory unit, wherein the memory unit may be constructed and arranged to store multiple edge measurements of one or more structural elements after a completion of each one out of multiple manufacturing phases; wherein the processor may be constructed and arranged to (a) generate spatial spectrums, based on the multiple edge measurements, for each one of the multiple manufacturing phases; (b) determine relationships between bands of the spatial spectrums; and (c) search for at least one manufacturing process defect based on the relationships between the bands of the spatial spectrums.

The system may execute the above method.

The system may be a computer or may include a computer. The system may be a charged particle metrology tool or may differ from a charged particle metrology tool.

There may be provided a metrology system that may be a diverse metrology system that may perform (alone or in combination with another computer) different types of measurements such as critical dimension (CD) measurements, edge roughness measurements, overlay measurements and the like.

The diverse metrology system may also be referred to as a "charged particle metrology tool" or a "system" or a "diverse system".

FIG. 1 illustrates an example of method 800.

Method 800 may start by step 802 of irradiating, by a charged particle metrology tool, multiple locations of an object and generating detection signals indicative of scattered and/or reflected particles.

The charged particle metrology tool may be configured to generate (alone or in combination with another computer) critical dimension information, edge roughness information, and/or overlay information.

Step 802 may be followed by step 803 of processing the detection signals.

Step 803 of processing may include at least one out of:
a. Step 804 of applying an adaptive wafer sampling. Step 804 may include selecting the next locations to be irradiated by the system based on the outcome of the previous measurements. For example—determine to perform more measurements at regions that exhibit larger CD variations than other regions. Step 804 may be followed by step 802.
b. Step 806 of suggesting (or forcing) modification in one or more manufacturing process based on the possible manufacturing process problems. Step 806 may include modifying manufacturing process parameters of various knobs such as lithography, etch, deposition, CMP, Epi and the like. Step 806 may include detecting possible manufacturing process problems.
c. Step 808 may include estimating measurement results based on the measurements acquired during step 804.

Step 803 may include applying one or more techniques such as using machine learning processes such as but not limited to deep learning.

Figure 2:
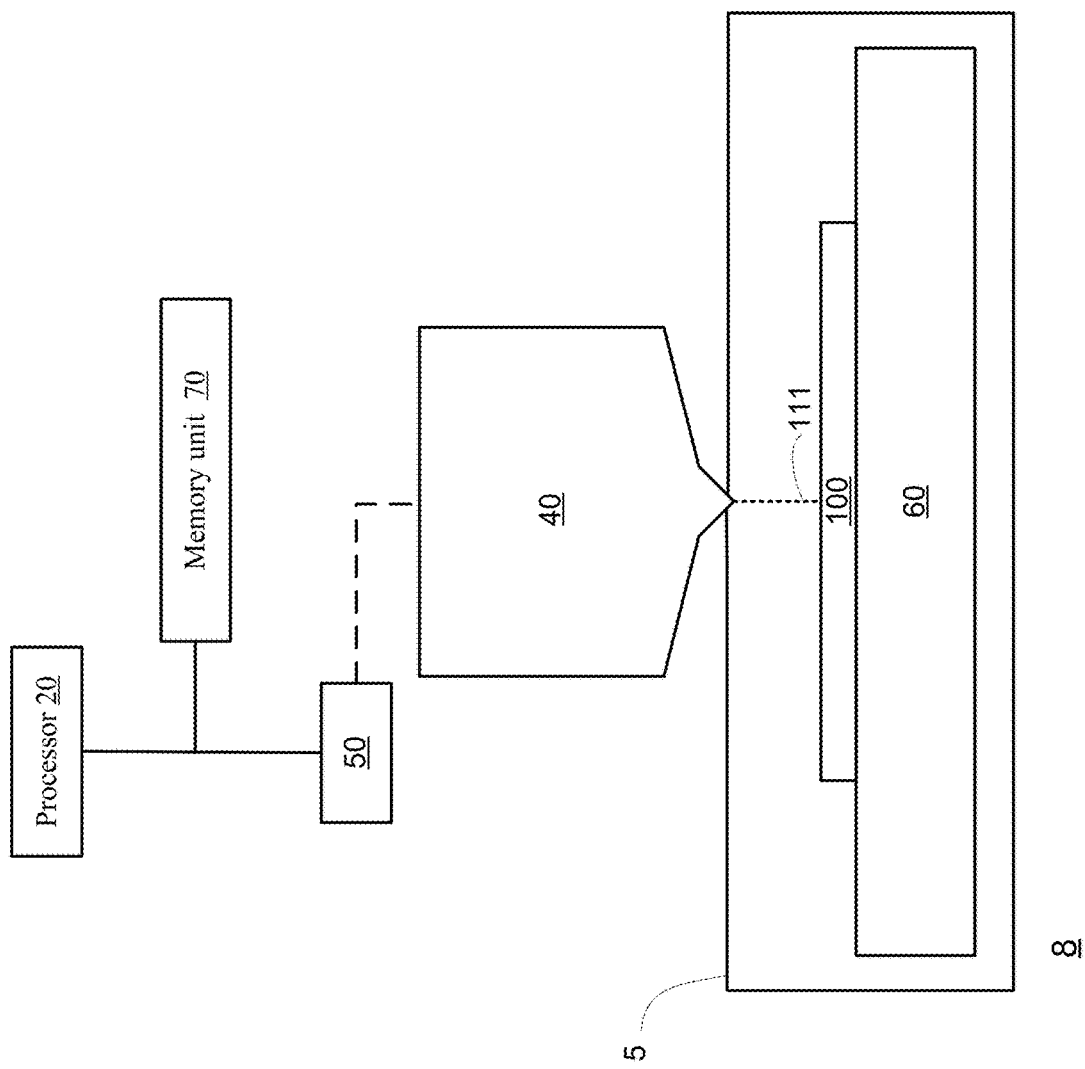
FIG. 2 illustrates an example of a specimen and a system.

FIG. 2 illustrates an example of system 8 and specimen 100 according to an embodiment of the invention.

System 8 includes vacuum chamber 5, movement and support system (chuck, and one or more mechanical stages) that may include movable stage 60, a charged particle beam optics 40, controller 50, memory unit 70 and processor 20.

Charged particle beam optics 40 may irradiate specimen 100 with one or more charged particle beams such as a charged particle beam 111 that may be a primary electron beam.

System 8 may include one or more detectors, at least one in-lens detector (within column) and/or at least one out of lens detector (outside column).

System 8 may include any type of detectors including a secondary electron (SE) detector, a backscattered electron (BSE) detector, an X-ray detector, and the like.

System 8 may process detection signals to provide critical dimension information, edge roughness information and overlay information.

Figure 3:
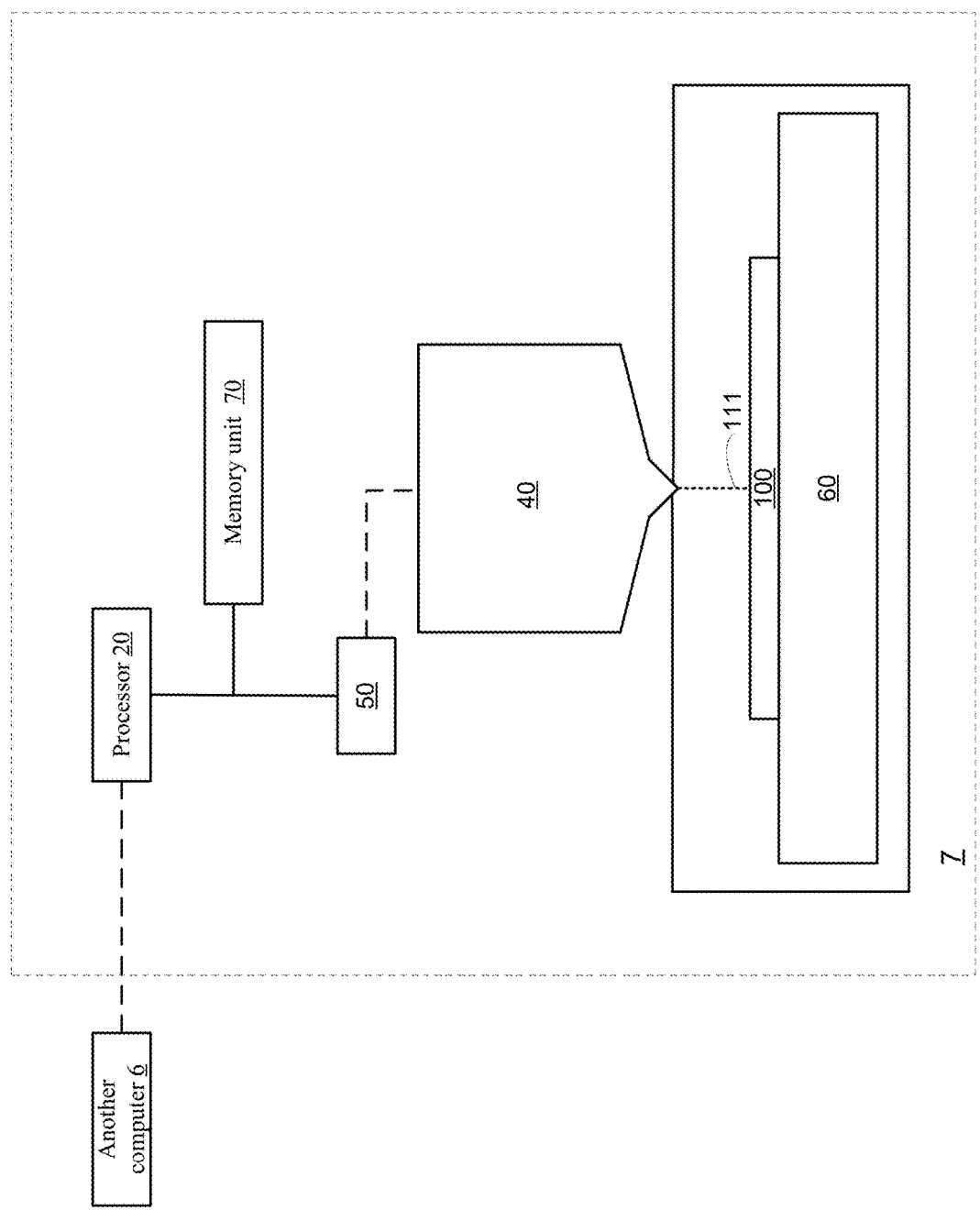
FIG. 3 illustrates an example of a specimen and a system.

FIG. 3 illustrates an example of system 7 and specimen 100 according to an embodiment of the invention.

FIG. 3 also shows another computer 6 that may process detection signals or processes information provided from system 7 to provide critical dimension information, edge roughness information and overlay information.

Figure 4:
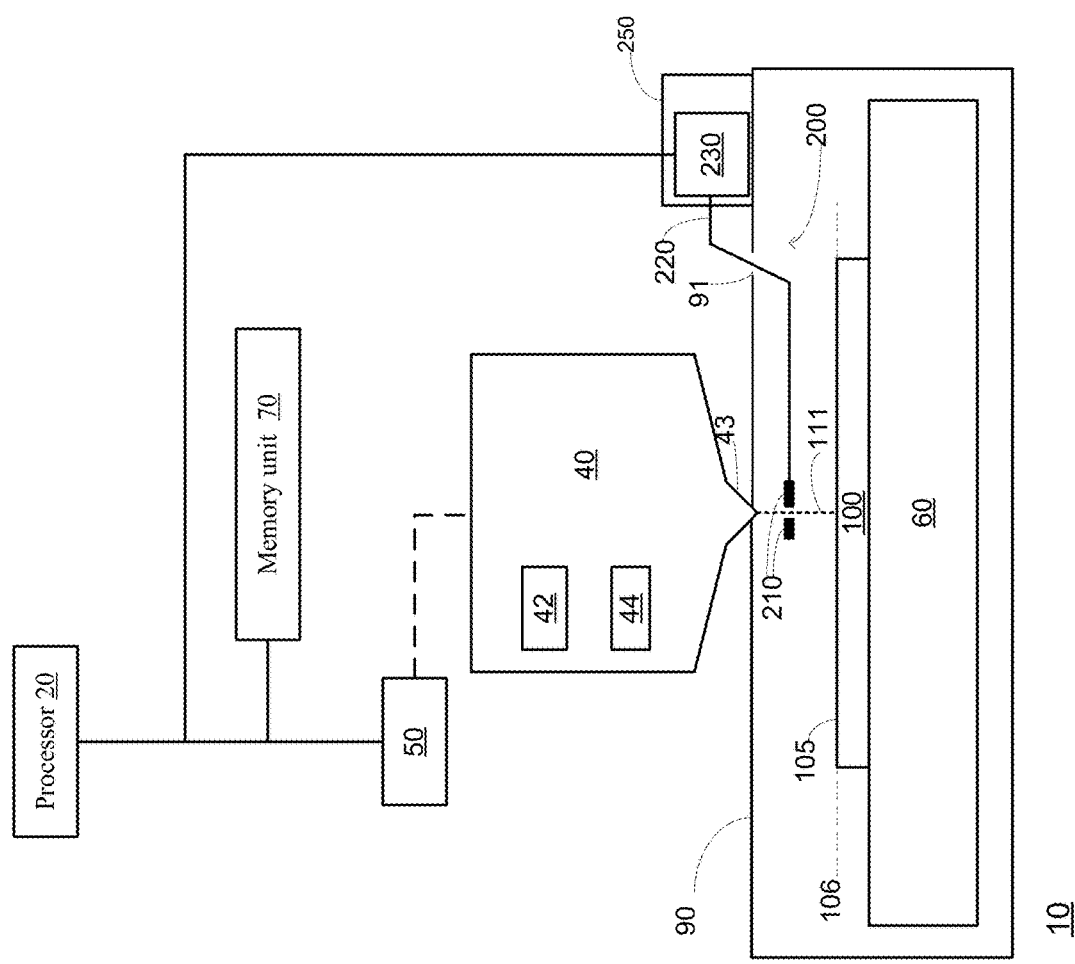
FIG. 4 illustrates an example of a specimen and a system.

FIG. 4 illustrates an example of charged particle beam system 10 that includes controller 50, movable stage 60, charged particle beam optics 40, an energy dispersive X-ray (EDX) detector 200, EDX detector motion module 250, specimen chamber 90, memory unit 70 and processor 20.

EDX detector 200 is a non-limiting example of a detector. For example—EDX detector 200 can be replaced by a BSE detector or any other detector of the same shape and/or size or of different shape and/or size.

Controller 50 is configured to control the operation of at least some of the various components of charged particle beam system 10.

Movable stage 60 is configured to support specimen 100 and move specimen according to a mechanical scan pattern.

Charged particle beam optics 40 is configured to (a) generate a primary charged particle beam 111, (b) deflect and otherwise direct the primary charged particle beam 111 to exit through charged particle beam optics tip 43 to impinge on flat surface 105 of specimen 100, (c) detect electrons that are emitted from flat surface 105.

In FIG. 4 the charged particle beam optics 40 is illustrated as including in-lens secondary electron detector 42 and in-lens backscattered electron detector 44. It is noted that charged particle beam optics 40 may include one or more electron out-lens electron detectors, may have only one or more secondary electron detectors, may include only one or more backscattered electron detectors or may include any combination of electron detectors.

EDX detector motion module 250 is configured to move the EDX detector 200 between a first position and a second position.

Specimen 100 may be a wafer, a micro-machined object, a solar panel or the like. Specimen 100 may be relatively large (for example—have a diameter of 300 millimeters or more) and EDX detector, even when positioned at the second, position may be positioned directly above specimen 100.

Accordingly, the projection of the EDX detector 200 on plane 106 virtually falls on specimen 100 when the EDX detector 200 is positioned at the first position and when the EDX detector is positioned at the second position.

EDX detector 200 includes EDX detector tip 210, EDX detector conduit 220 and EDX detector amplifier 230.

FIG. 4 illustrates EDX detector 200 as being positioned in a first position in which EDX detector tip 210 is positioned between charged particle beam optics tip 43 and specimen 100. Primary charged particle beam 111 passes through an aperture formed in EDX detector tip 210. EDX detector conduit 220 passes through a specimen chamber opening 91.

When EDX detector 200 is positioned at the first position, the EDX detector tip 210 is very close (for example—few tenths of nanometers) to flat surface 105 and thus EDX detector 200 is able to detect x-ray photons that propagate within a large angular range than EDX detectors 200 that are more distant from flat surface 105.

Furthermore—when placing windows on both sides of the aperture—the EDX detector 200 may provide a symmetrical coverage of emitted x-ray photons.

Movable stage 60 may follow a mechanical scan pattern and charged particle beam optics 40 may deflect primary charged particle beam 111 thereby scanning flat surface 105.

X-ray photons emitted as a result of the scanning of flat surface 105 enter the window of EDX detector tip 210 and are detected by an x-ray sensitive element of the EDX detector 200. The x-ray sensitive element may be a photodiode. The x-ray sensitive element generates detection signals indicative of the detected x-ray photons. The detection signals are sent via EDX detector conduit 220 to EDX detector amplifier 230 and may be stored in memory unit 70 or processed by processor 20. It is noted that the detection signals may be converted to digital detection signals by EDX detector amplifier 230 or by an analog to digital converter that does not belong to EDX detector amplifier 230.

Processor 20 may correlate or otherwise associate between points of the specimen that were illuminated (by primary charged particle beam 111) during the scanning of flat surface 105 and detection signals generated by the EDX detector.

Processor 20 may be configured to evaluate compositions of the points of the specimen that were illuminated during the scanning of the flat surface 105.

Figure 5:
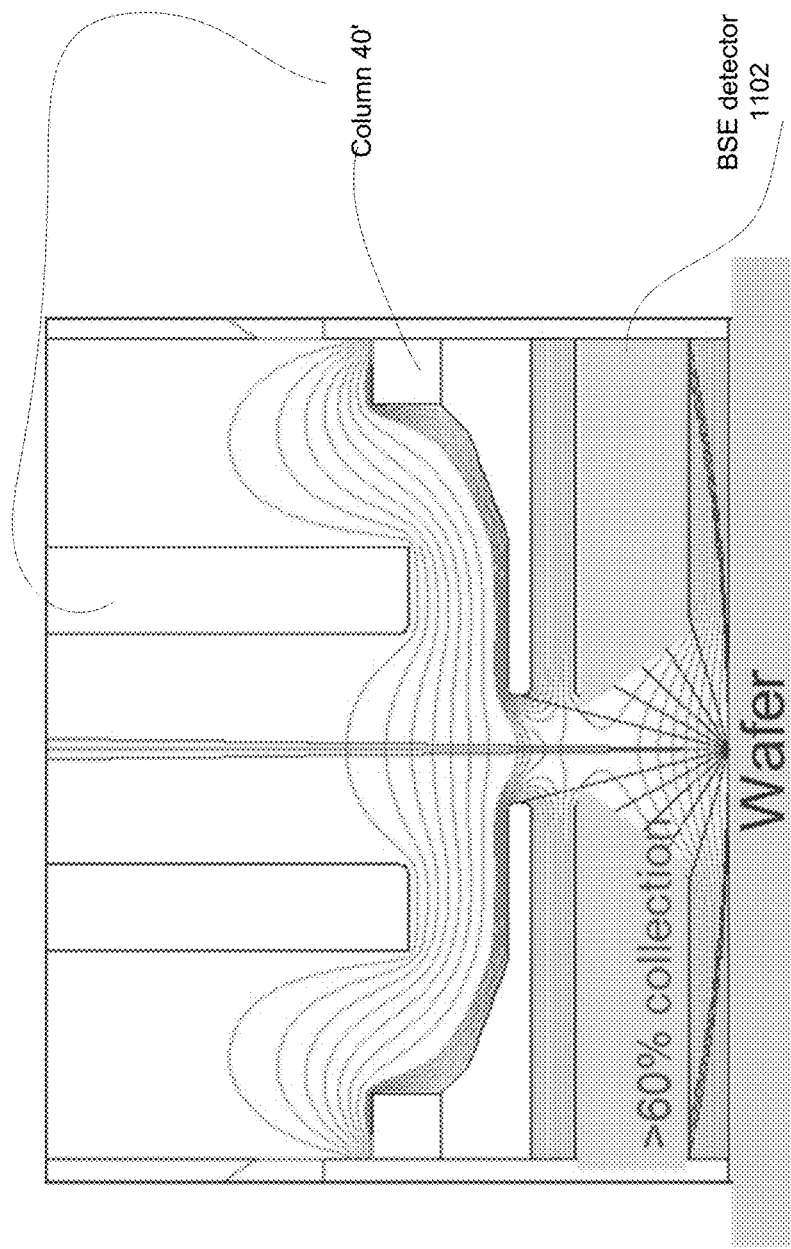
FIG. 5 illustrates an example of a specimen and a part of a system.

FIG. 5 illustrates a (backscattered electron) BSE detector 1102 that is positioned below column 40'. The positioning of the BSE detector below column 40', near the object and having relatively large sensing surfaces, provides a highly effective collection of BSEs and provide overlay information—when combining BSE detection and (secondary electron) SE detection.

Column 40' is an example of a charged particle beam optics.

Figure 6:
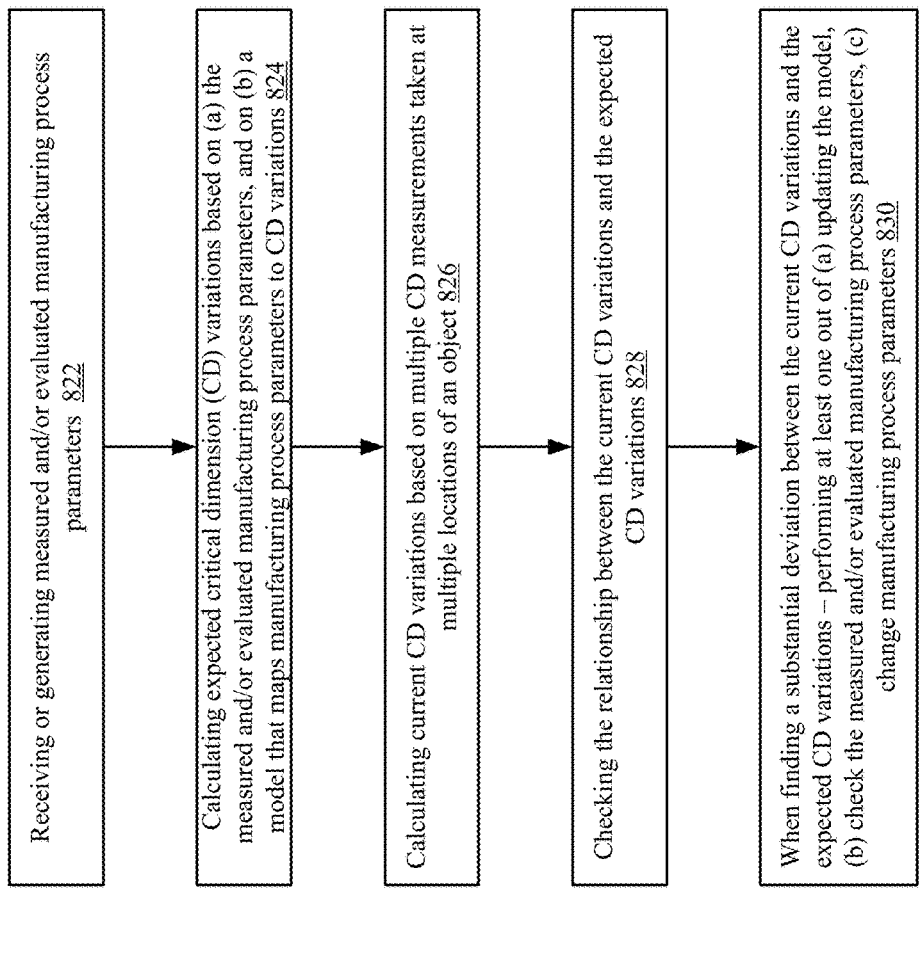
FIG. 6 illustrates an example of a method.

FIG. 6 illustrates an example of method 820.

Method 820 may include a sequence of steps 822, 824, 826 and 828.

Step 822 may include receiving or generating measured and/or evaluated manufacturing process parameters.

Step 824 may include calculating expected critical dimension (CD) variations based on (a) the measured and/or evaluated manufacturing process parameters, and on (b) a model that maps manufacturing process parameters to CD variations.

Step 826 may include Calculating current CD variations based on multiple CD measurements taken at multiple locations of an object.

Step 828 may include checking the relationship between the current CD variations and the expected CD variations. This may include checking if there is a substantial deviation. What amounts to a substantial deviation may be defined by any party. For example—a substantial deviation may be regarded as a deviation that may affect yield, may substantially affect the performance of the dies of the wafer, or the like.

Step 830 may perform—when finding a substantial deviation between the current CD variations and the expected CD variations—at least one out of (a) updating the model, (b) check the measured and/or evaluated manufacturing process parameters, (c) change manufacturing process parameters.

The checking of the measured and/or evaluated manufacturing process parameters may include performing another measurement, checking for sensor errors, and the like.

Non-limiting examples of evaluated manufacturing process parameters may include temperature, gaseous pressure, radiation intensity, and the like.

Figure 7:
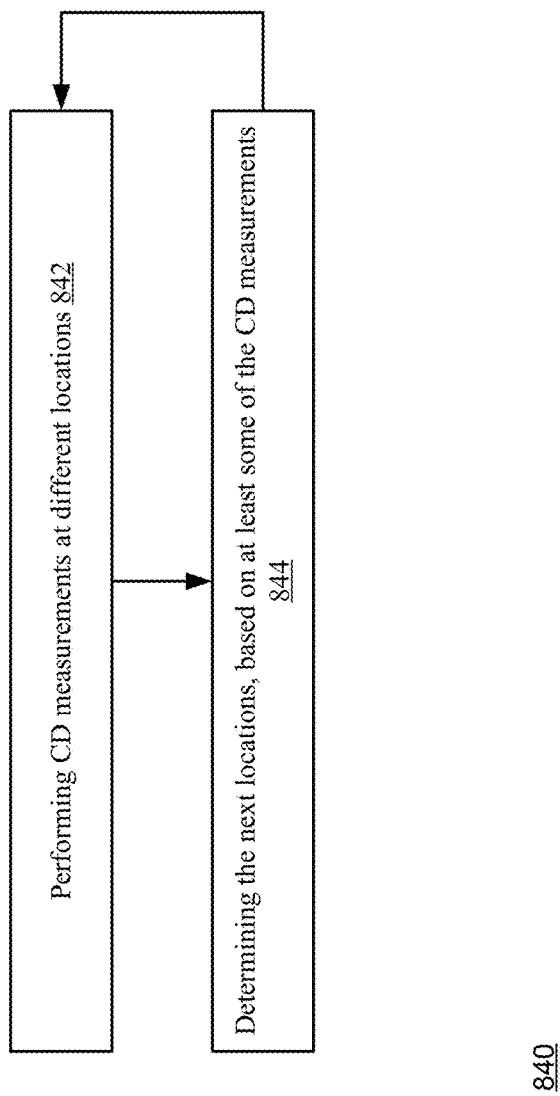
FIG. 7 illustrates an example of a method.

FIG. 7 illustrates an adaptive wafer sampling.

The adaptive wafer sampling 840 may be applied during step 802 of method 800, and/or during step 822 of method 820.

The adaptive wafer sampling 840 may include step 842 and step 844. Multiple repetitions of steps 842 and 844 may be performed.

Step 842 may include performing CD measurements at different locations.

Step 844 may include determining the next locations, based on at least some of the CD measurements.

CD measurements will be performed at the next locations during the next iteration of step 842.

Figure 8:
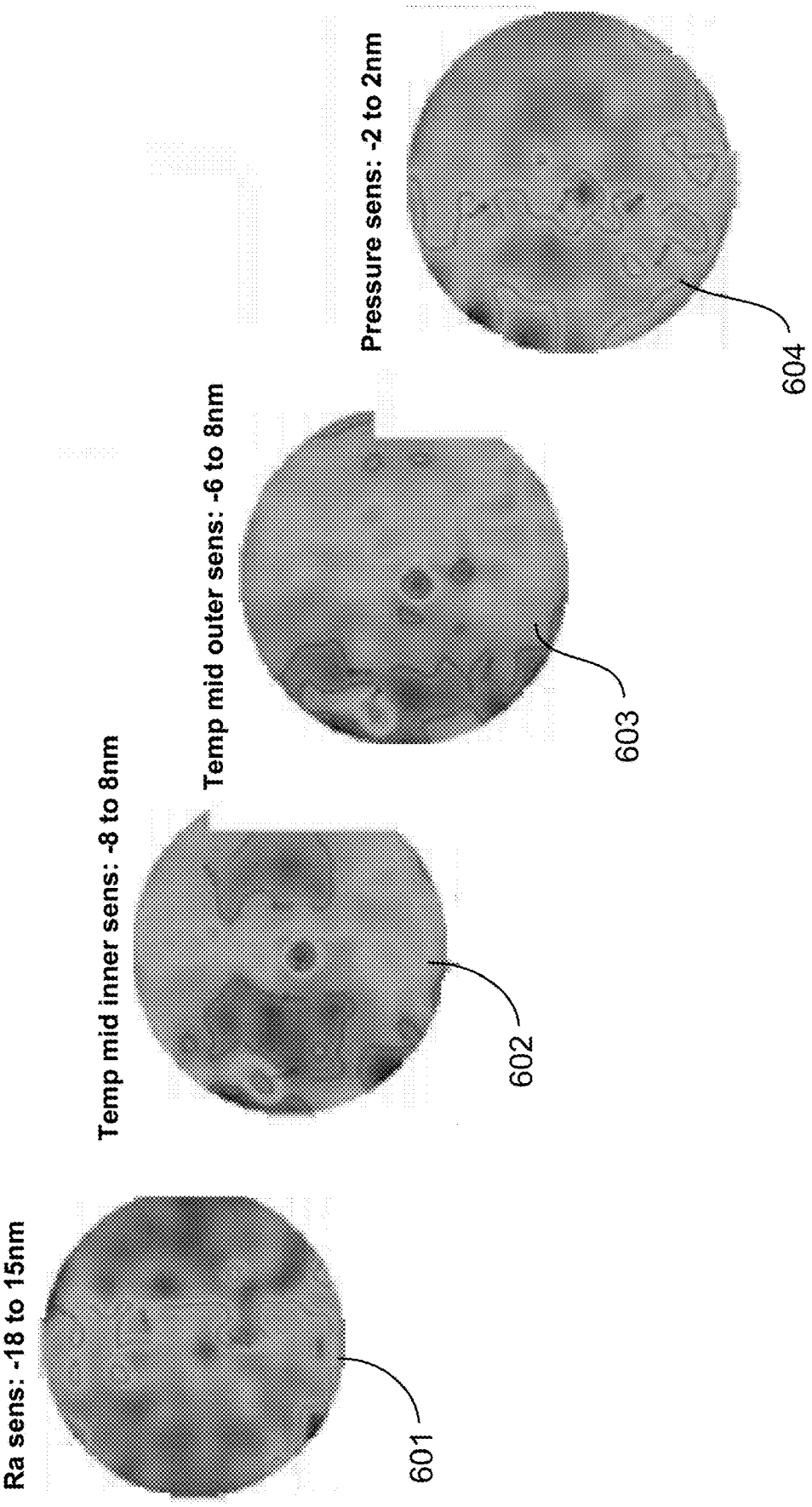
FIG. 8 illustrates examples of critical dimension sensitivity maps.

FIG. 8 illustrates CD variation sensitivity maps 601, 602, 603 and 604. Each CD variation sensitivity map illustrates the sensitivity of expected or actual CD variations to changes in a manufacturing process parameter.

When it is determined to change, modify or set a manufacturing process parameter in order to reach desired CD variations, then the CD variation sensitivity maps can be considered.

Figure 9:
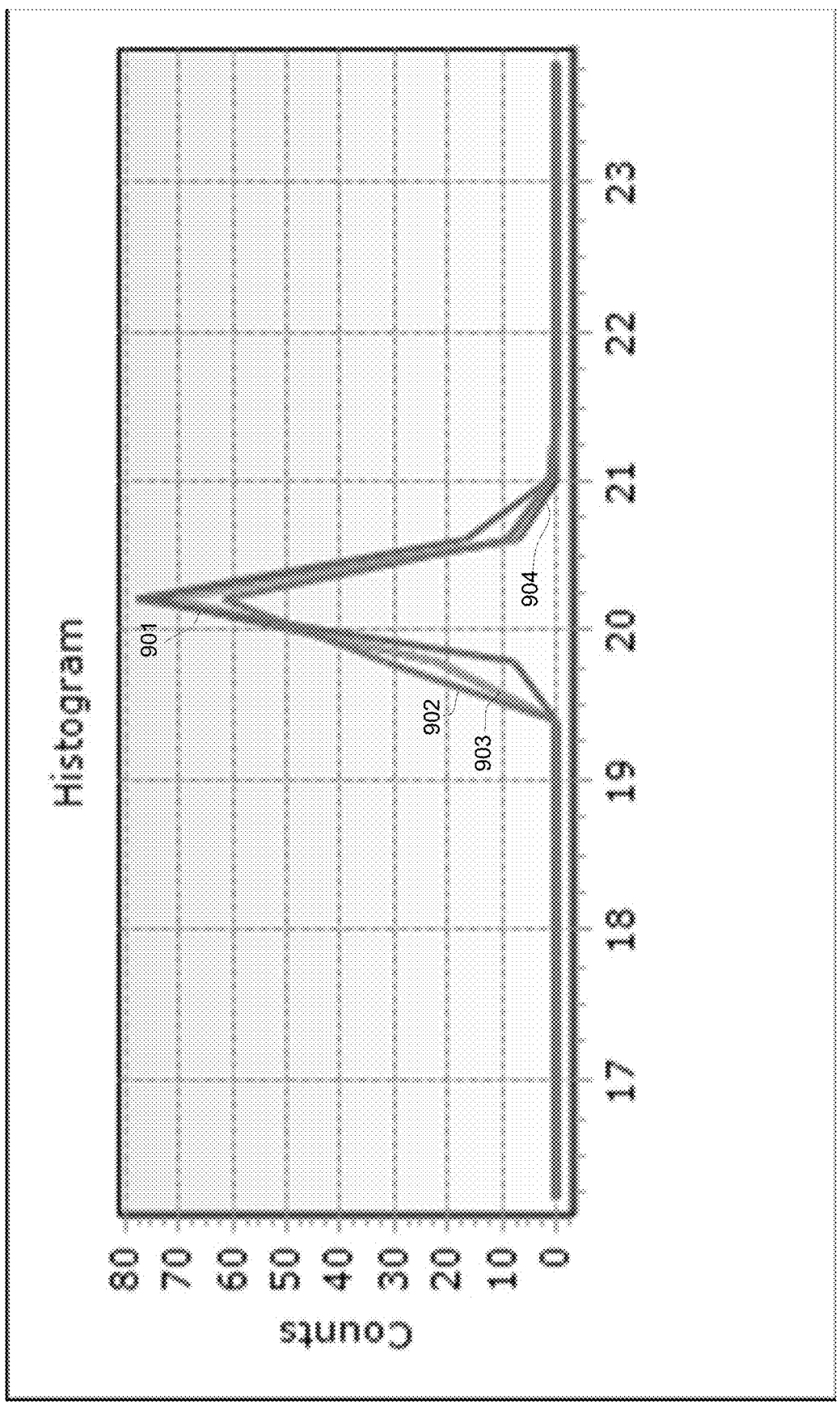
FIG. 9 illustrates examples of histograms of critical dimensions.

FIG. 9 illustrates various CD histograms 901, 902, 903 and 904.

Figure 10:
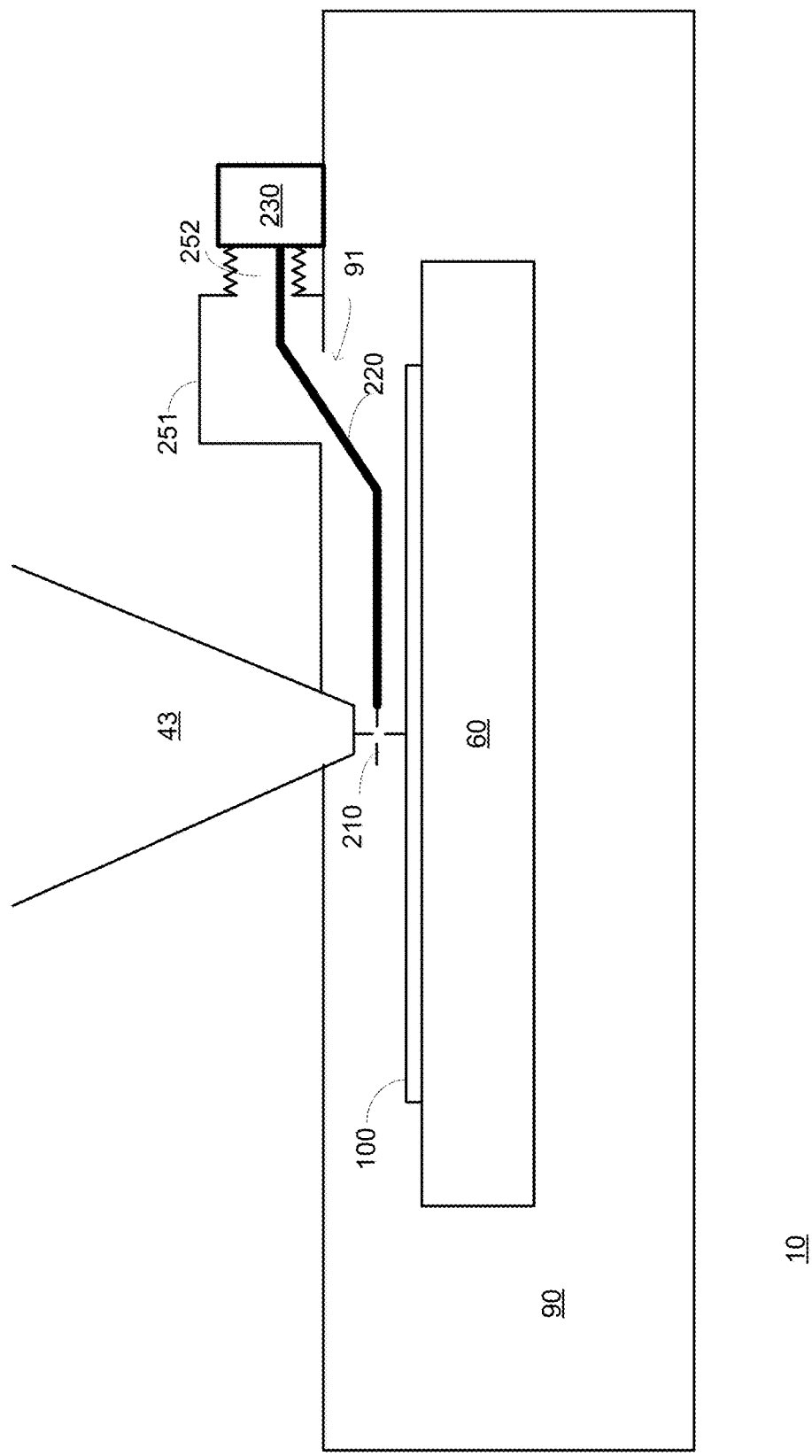
FIG. 10 illustrates an example of a cross section of a system and a specimen.

FIG. 10 is a cross sectional view of charged particle beam system 10 and specimen 100 according to an embodiment of the invention.

EDX detector amplifier 230 is positioned outside specimen chamber 90 and EDX detector tip 210 is positioned within specimen chamber 90—at least when EDX detector 200 is positioned at the first position.

EDX detector tip 210 is coupled to EDX detector amplifier 230 via EDX detector conduit 220. In FIG. 10 the EDX detector 200 is positioned at a first position and the primary charged particle beam passes through an aperture formed in EDX detector tip 210.

EDX detector conduit 220 passes through specimen chamber opening 91.

Specimen 100 is supported by movable stage 60.

In order to maintain very low chamber pressure the specimen chamber 90 should be sealed regardless of the position of the EDX detector 200.

The sealing is obtained by including a cover 251 and bellows 252 that surround EDX detector conduit 220 and seal the EDX detector conduit 220 and the specimen chamber 90 from the environment.

Bellows 252 is flexible and is connected between EDX detector amplifier 230 and cover 251.

Figure 11:
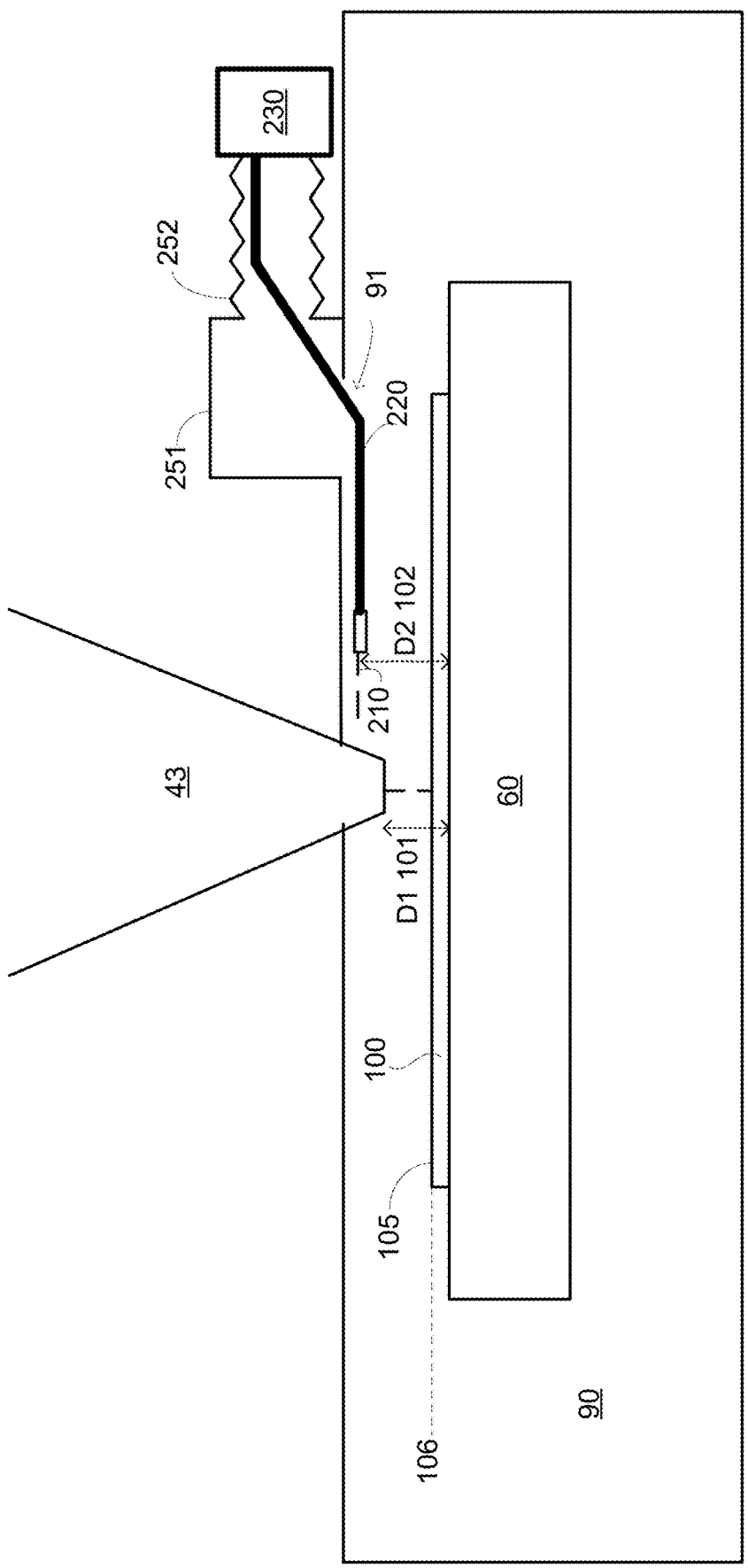
FIG. 11 illustrates an example of a cross section of a system and a specimen.

FIG. 11 is a cross sectional view of charged particle beam system 10 and specimen 100 according to an embodiment of the invention.

FIG. 11 illustrates a detector such as but not limited to an EDX detector 200 as being positioned in a second position in which EDX detector tip 210 is spaced apart from the charged particle beam optics tip 43 and the specimen 100. EDX detector tip 210 does not interfere with any measurements performed by charged particle beam optics 40.

When in the second position, the distance (D1 101) between EDX detector tip 210 and the movable stage 60 is less than the distance (D2 102) between the movable stage and the charged particle beam optics tip 43.

The EDX detector 200 can be moved in various manners between the first and second positions. For example, EDX detector 200 can be moved towards the first position by a downwards and leftward (or outward) movement.

Figure 12:
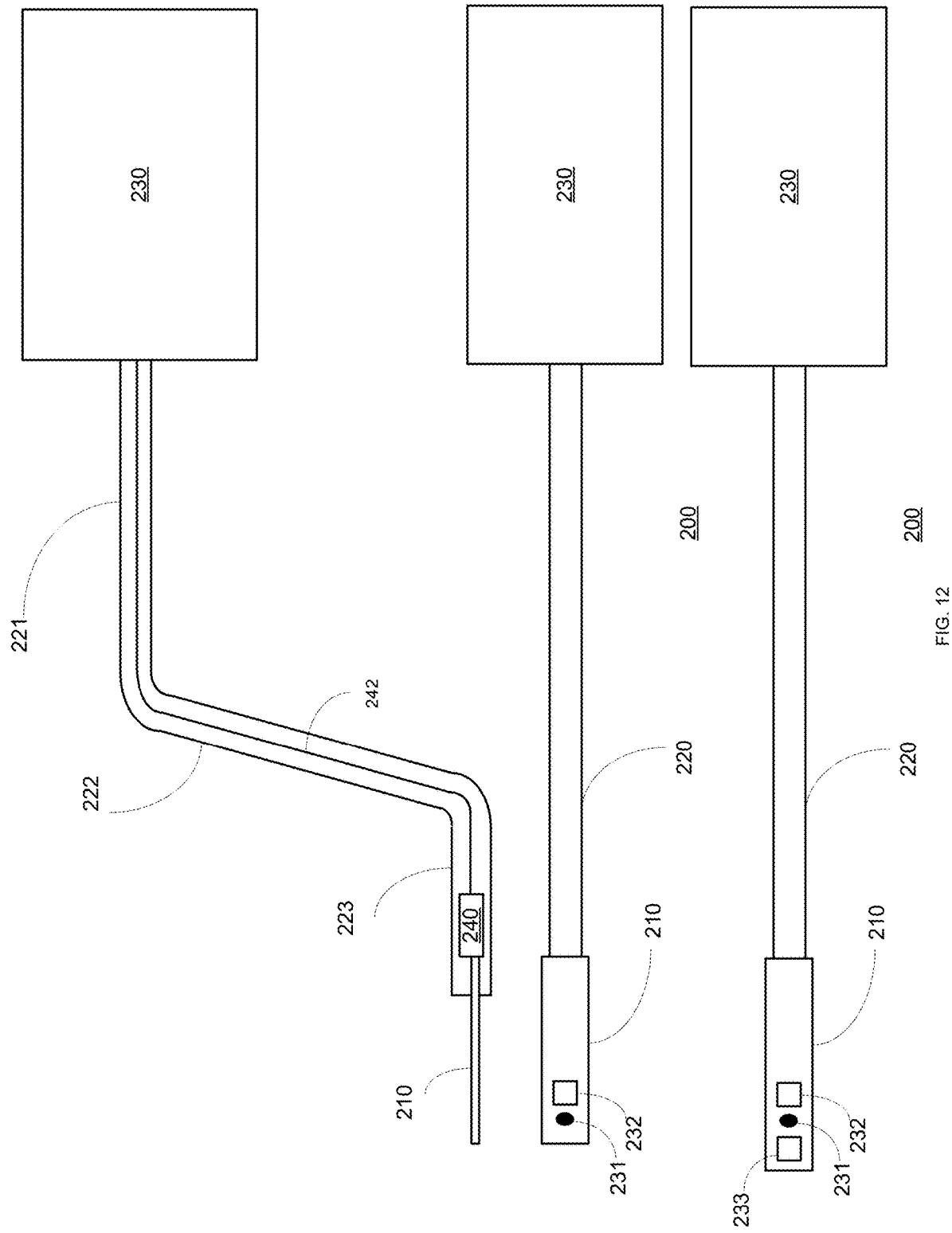
FIG. 12 illustrates an example of a detector.

FIG. 12 includes a top view and a side view of EDX detector 200 according to an embodiment of the invention.

EDX detector tip 210 is coupled to EDX detector amplifier 230 via EDX detector conduit 220.

EDX detector tip 210 is illustrates as including aperture 231 and window 232. A primary charged particle beam may pass through aperture 231 when EDX detector 200 is at a first position. X-ray photons emitted from the specimen pass through window 232 and are detected by x-ray sensitive element 240 of EDX detector 200. The x-ray sensitive element 240 may be position within EDX detector tip 210 but this is not necessarily so.

X-ray sensitive element 240 generates detection signals that are sent, via conductor 242 to EDX detector amplifier 230.

EDX detector conduit 220 is illustrated as including upper horizontal portion 221, lower horizontal portion 223 and sloped intermediate portion 222 that is connected between the upper horizontal portion 221 and the lower horizontal portion 223.

EDX detector conduit 220 may be rigid or elastic. EDX detector conduit 220 may have any shape or size.

FIG. 12 also illustrates an alternative configuration of EDX detector tip 210—that includes multiple windows 232 and 233 that are arranged in a symmetrical manner on both sides of aperture 231.

Figure 13:
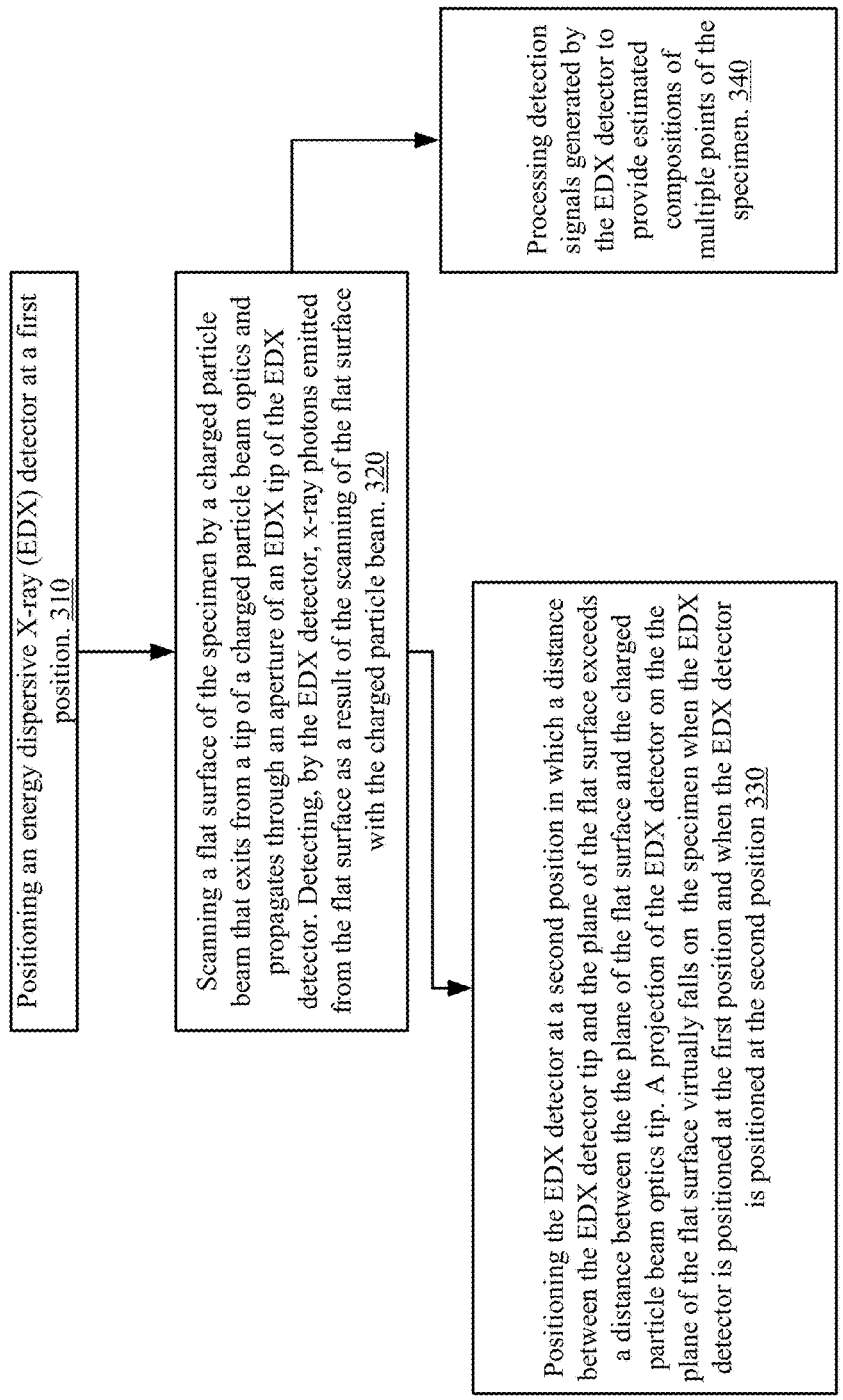
FIG. 13 illustrates an example of a method.

FIG. 13 illustrates method 300 according to an embodiment of the invention.

Method 300 may start by step 310 of positioning an energy dispersive X-ray (EDX) detector at a first position.

Step 310 may be followed by step 320 of (i) scanning a flat surface of a specimen by a charged particle beam that exits from a tip of a charged particle beam optics and propagates through an aperture of an EDX tip of the EDX detector; and (ii) detecting, by the EDX detector, x-ray photons emitted from the specimen as a result of the scanning of the flat surface with the charged particle beam.

Step 320 may be followed by steps 330 and 340.

Step 330 may include positioning the EDX detector at a second position in which a distance between the EDX detector tip and the plane of the flat surface exceeds a distance between the plane of the flat surface and the charged particle beam optics tip.

A projection of the EDX detector on a plane of the flat surface virtually falls on the flat surface when the EDX detector is positioned at the first position and when the EDX detector is positioned at the second position.

Step 340 may include processing detection signals generated by the EDX detector to provide estimated compositions of multiple points of the specimen.

The electron optics of the system may be electron optics of an electron microscope, of an electric beam imager, and the like. The electron optics may be a column of a scanning electron microscope. A non-limiting example of a scanning electron optics is illustrated in U.S. Patent Publication No. 2006/0054814 to Shemesh et al., which is incorporated herein by reference in its entirety.

The electron optics may be included in a system that applies any of the mentioned above methods.

Figure 14:
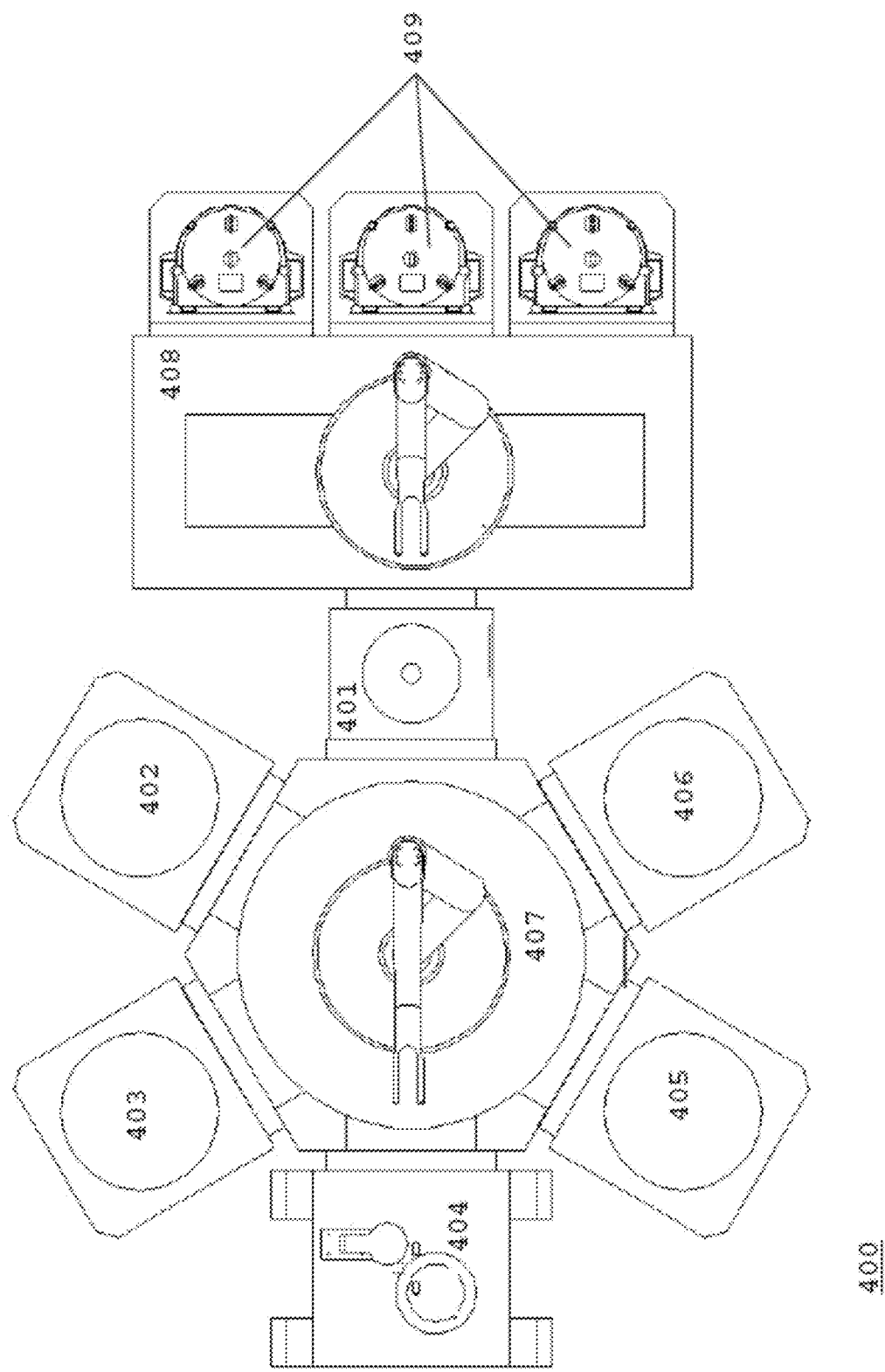
FIG. 14 illustrates an example of a cluster tool.

FIG. 14 illustrates an example of a cluster tool.

The cluster tool 400 may include various chambers including the diverse system 404 as well as processing chambers 402, 403, 405 and 406 that may perform various manufacturing steps such as lithography, etch, deposition, CMP, Epi, and the like.

Suggestions or commands for modifying one or more manufacturing process parameters of processing chambers 402, 403, 405 and 406 may be based on the outcome of measurements performed by system 404.

Transfer chamber 407 may be used for transferring wafers or other objects between diverse system 404 as well as processing chambers 402, 403, 405 and 406.

A wafer or another object may be retrieved from cassettes 409 by interface 408 and fed, via load lock 401, to the transfer chamber 407.

Figure 15:
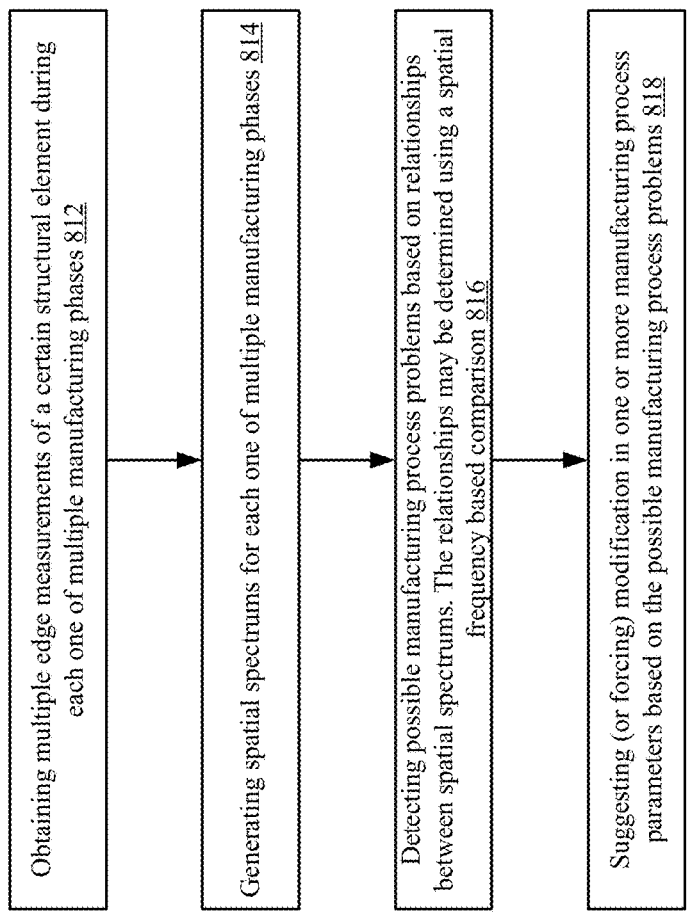
FIG. 15 illustrates an example of a method.

FIG. 15 illustrates an example of method 810.

Method 810 may include a sequence of steps 812, 814, 816 and 818.

Step 812 may include obtaining multiple edge measurements for each one of multiple manufacturing phase.

Step 814 may include generating spatial spectrums for each one of multiple manufacturing phases. Step 814 may include applying a spatial frequency transform on the multiple edge measurements.

Step 816 may include detecting possible manufacturing process problems based on relationships between spatial spectrums. The relationships may be determined using a spatial frequency-based comparison.

For example—the relationships may be made per spatial frequency band.

Step 818 may include suggesting (or forcing) modification in one or more manufacturing process parameters based on the possible manufacturing process problems.

Step 818 may include suggesting (or forcing) modifying manufacturing process parameters of various knobs such as lithography, etch, deposition, CMP, Epi and the like.

Figure 16:
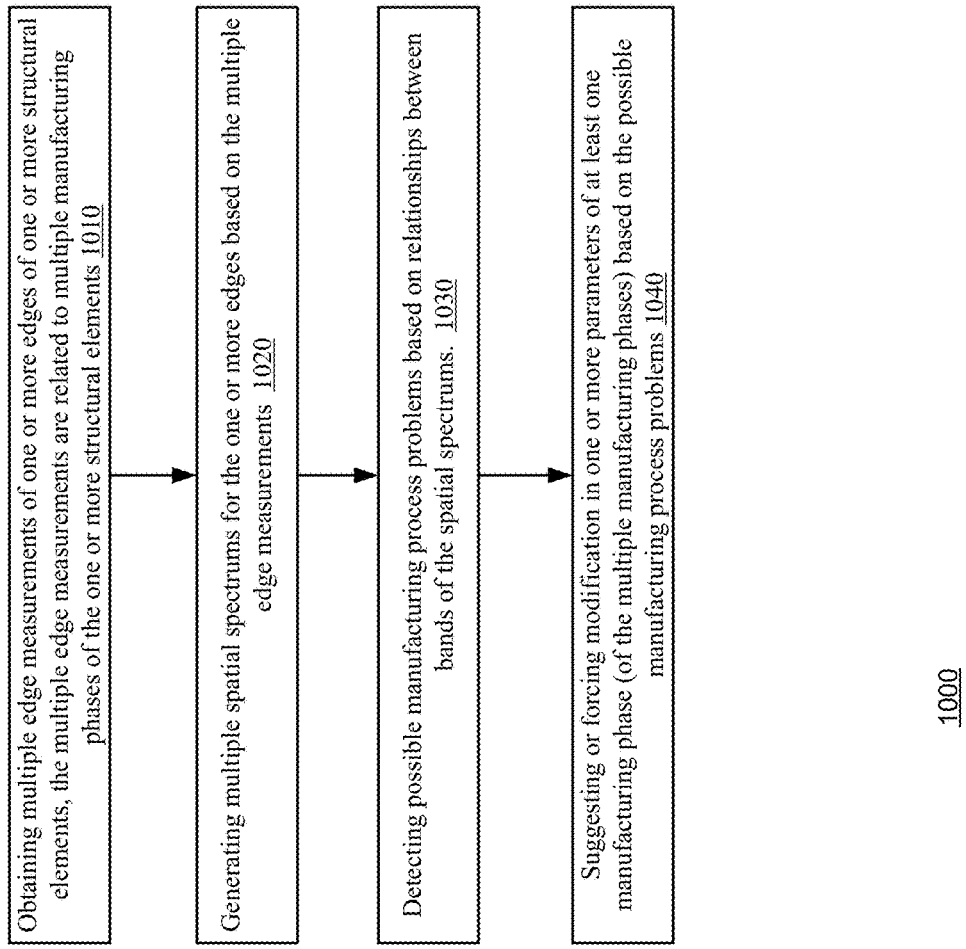
FIG. 16 illustrates an example of a method.

FIG. 16 illustrates an example of method 1000.

Method 1000 may include a sequence of steps 1010, 1020, 1030 and 1040.

Step 1010 may include obtaining multiple edge measurements of one or more edges of one or more structural elements. The multiple edge measurements are related to multiple manufacturing phases of the one or more structural elements.

Step 1020 may include generating multiple spatial spectrums related to the one or more edges based on the multiple edge measurements. Step 1020 may include applying a spatial frequency transform on the multiple edge measurements.

Step 1030 may include detecting possible manufacturing process problems based on relationships between spatial spectrums. The relationships may be determined using a spatial frequency-based comparison. For example—the relationships may be made per spatial frequency band. The relationships between all of the bands (or only some of the bands) may be determined.

Step 1040 may include suggesting (or forcing) modification in one or more manufacturing process parameters based on the possible manufacturing process problems.

Step 1040 may include suggesting (or forcing) modifying manufacturing process parameters of various knobs such as lithography, etch, deposition, CMP, Epi and the like.

Figure 17:
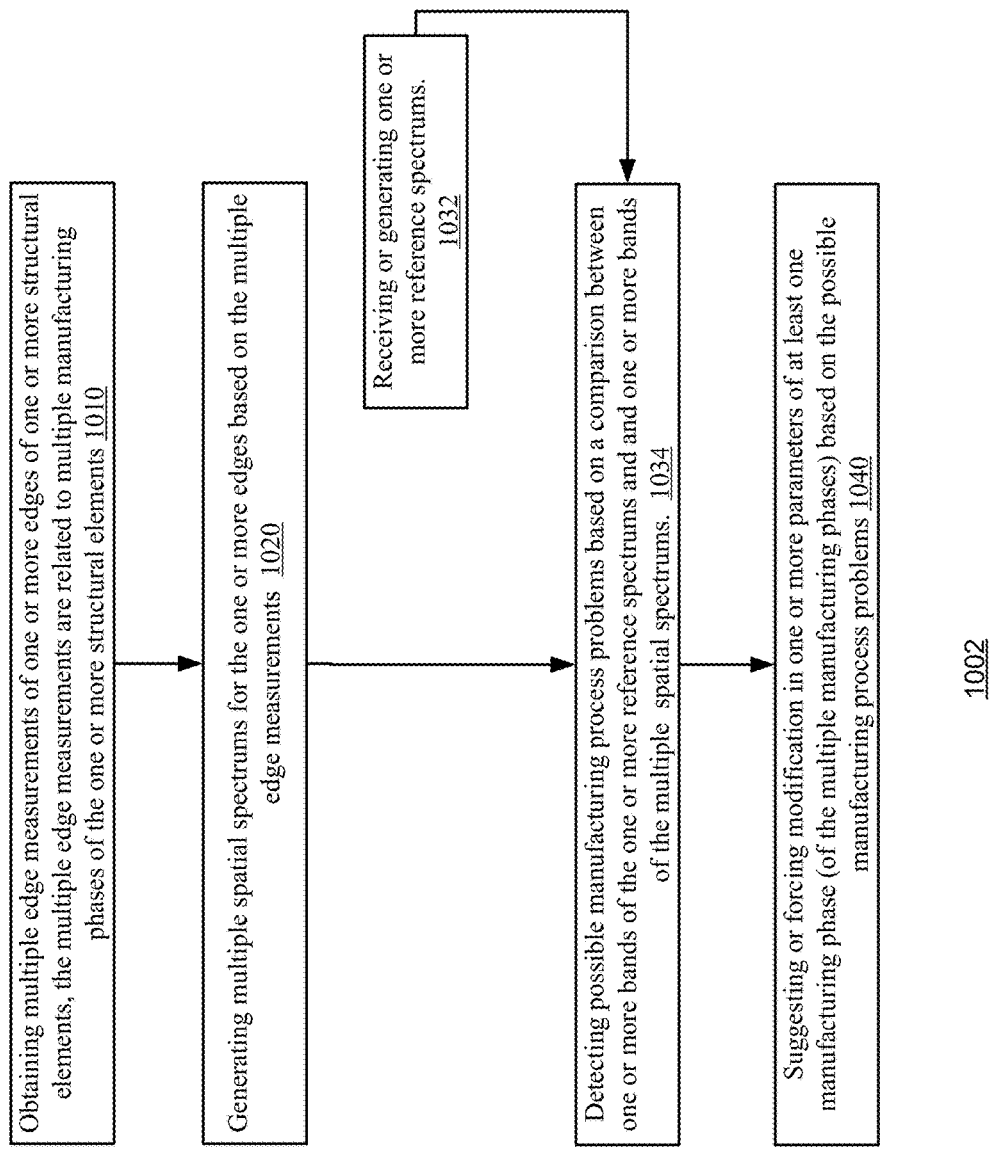
FIG. 17 illustrates an example of a method.

FIG. 17 illustrates an example of method 1002.

Method 1002 may include step 1032 and a sequence of steps 1010, 1020, 1034 and 1040. Step 1032 may be followed by step 1034.

Step 1010 may include obtaining multiple edge measurements of one or more edges of one or more structural elements. The multiple edge measurements are related to multiple manufacturing phases of the one or more structural elements.

Step 1020 may include generating multiple spatial spectrums for the one or more edges based on the multiple edge measurements. Step 1020 may include applying a spatial frequency transform on the multiple edge measurements.

Step 1032 may include receiving or generating one or more reference spectrums. Each reference spectrum may be generated in any manner—it may reflect actual spectrums of devices of ideal or acceptable edge roughness, it may be generated based on computer aided design files, it may be generated based on both actual spectrums and simulated (or otherwise calculated) spectrums, and the like.

Step 1034 may include detecting possible manufacturing process problems based on a comparison between one or more bands of the one or more reference spectrums and one or more bands of the multiple spatial spectrums.

Step 1040 may include suggesting (or forcing) modification in one or more manufacturing process parameters based on the possible manufacturing process problems. Step 1040 may include suggesting (or forcing) modifying manufacturing process parameters of various knobs such as lithography, etch, deposition, CMP, Epi and the like.

Figure 18:
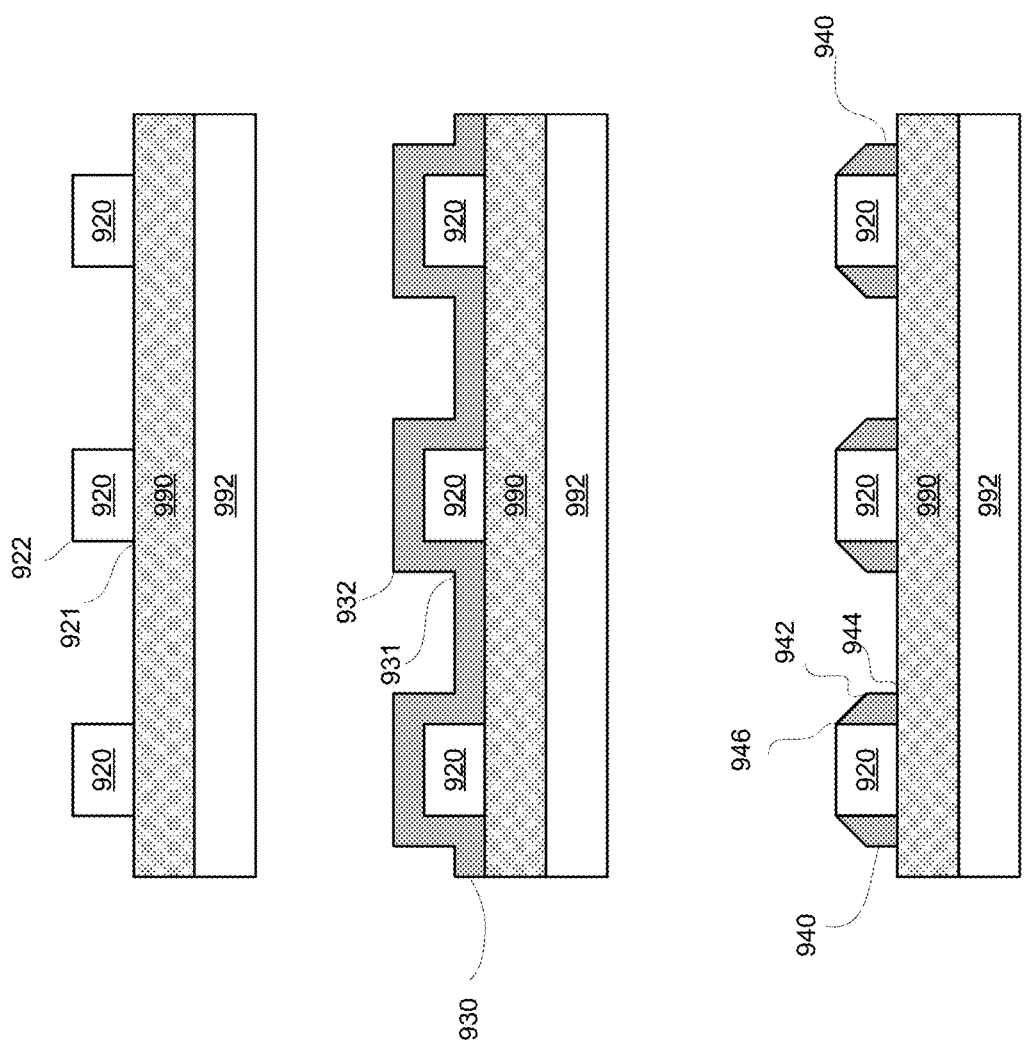
FIGS. 18-19 illustrate various manufacturing phases and edges that are measured after a completion these manufacturing phases.
Figure 19:
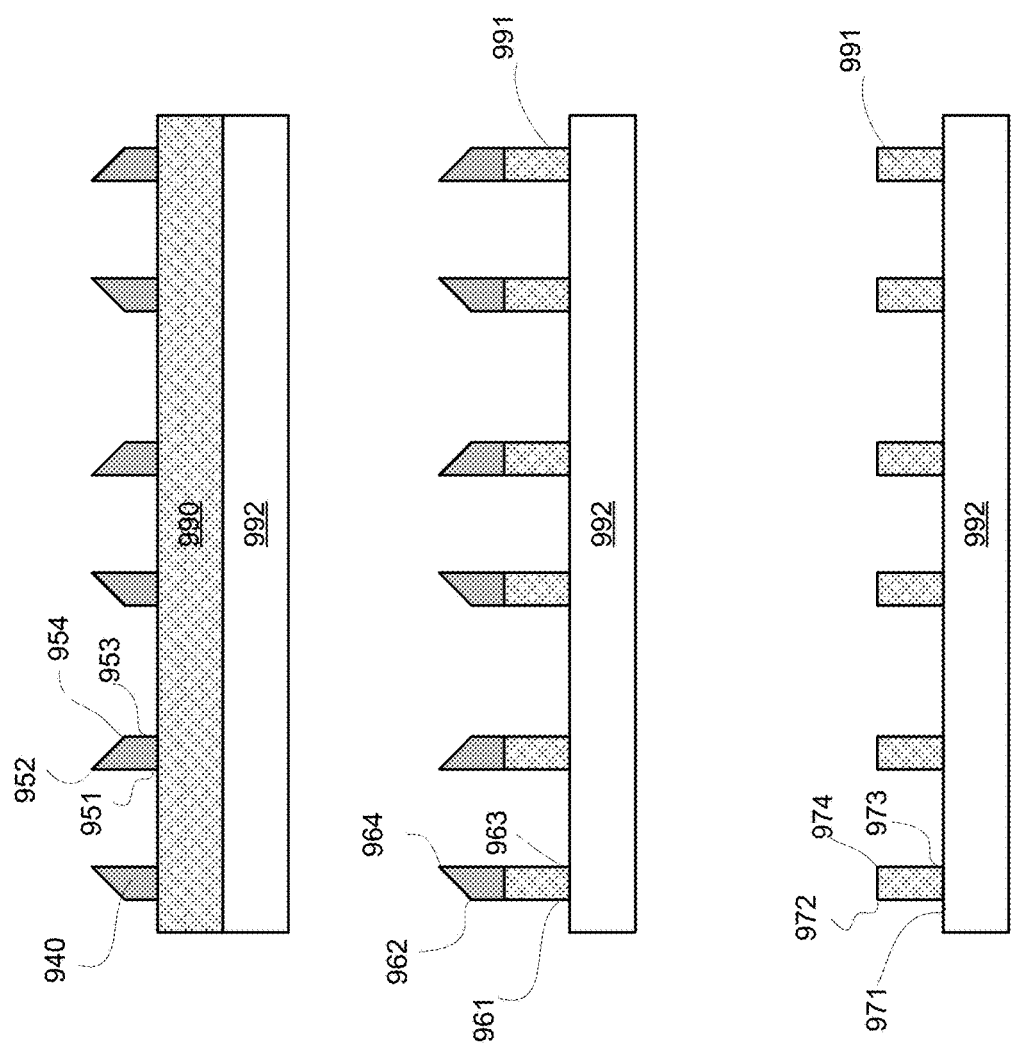

FIGS. 18 and 19 illustrate an example of a multiple patterning process such as a self-aligned double patterning (SADP) process and various edges that may be measured during any of the methods illustrated in the specification.

The multiple patterning process includes multiple manufacturing phases. FIG. 18-19 illustrate six manufacturing phases. Each manufacturing phase may affect the roughness of edges. By comparing the spectrums of different edges the method may provide an indication of which manufacturing phase is defective, what defects are introduced by each manufacturing phase—and may indicate what changes in any of the manufacturing phases should be done. The comparison is done on a frequency band basis.

The SADP process may include:
a. One or more initial stages during which a base layer 992, an intermediate layer 990 and multiple mandrels 920 are formed. The intermediate layer 990 is positioned between the base layer 992 and the mandrels 920. The mandrels 920 are spaced apart from each other. One or more top edges and/or one or more bottom edges (for example top edge 922 and bottom edge 921) of the mandrels may be measured.
b. Depositing a spacer layer 930. One or more top edges and/or one or more bottom edges (for example top edge 932 and bottom edge 931) of the spacer may be measured.
c. Etching the spacer by removing spacer portions that previously covered the mandrels and leaving spacer portions 940 at the sides of the mandrels. One or more top edges and/or one or more bottom edges (for example top edges 946 and 942 and bottom edge 944) of the spacer portions 940 may be measured.
d. Removing the mandrels 920. One or more top edges and/or one or more bottom edges (for example top edges 952 and 954 and bottom edges 951 and 953) of the spacer portions 940 may be measured.
e. Etching the intermediate layer 990 using the spacer portions as a mask to form structures that include intermediate layer portions 991 below spacer portions 940. One or more top edges and/or one or more bottom edges (for example top edges 962 and 964 and bottom edges 961 and 963) of the structures may be measured.
f. Removing the spacer portions 940 and exposing the intermediate layer portions 991. One or more top edges and/or one or more bottom edges (for example top edges 972 and 974 and bottom edges 971 and 973) of the intermediate layer portions 991 may be measured.

It should be noted that the intermediate layer portions 991 may be come mandrels of yet another patterning process.

The comparison between spatial spectrums of edges may include comparing spatial spectrums related to edges of structural elements that are related to each other. Structural elements that are related to each other may be positioned at substantially the same locations and/or may contact each other during one or more manufacturing phases. For example—a mandrel may be related to a spacer that is deposited on the mandrel, may be related to a spacer portion that contacts the mandrel, may be related to a spacer portion that contacted the mandrel before the mandrel was removed, may be related to an intermediate layer portion that was exposed using the spacer portion that was previously connected to the mandrel, and the like.

The comparison may provide indications of edge roughness translations—how a process manufacturing phase translated an edge roughness of a certain edge to an edge roughness of an edge of a related structural element.

Figure 20:
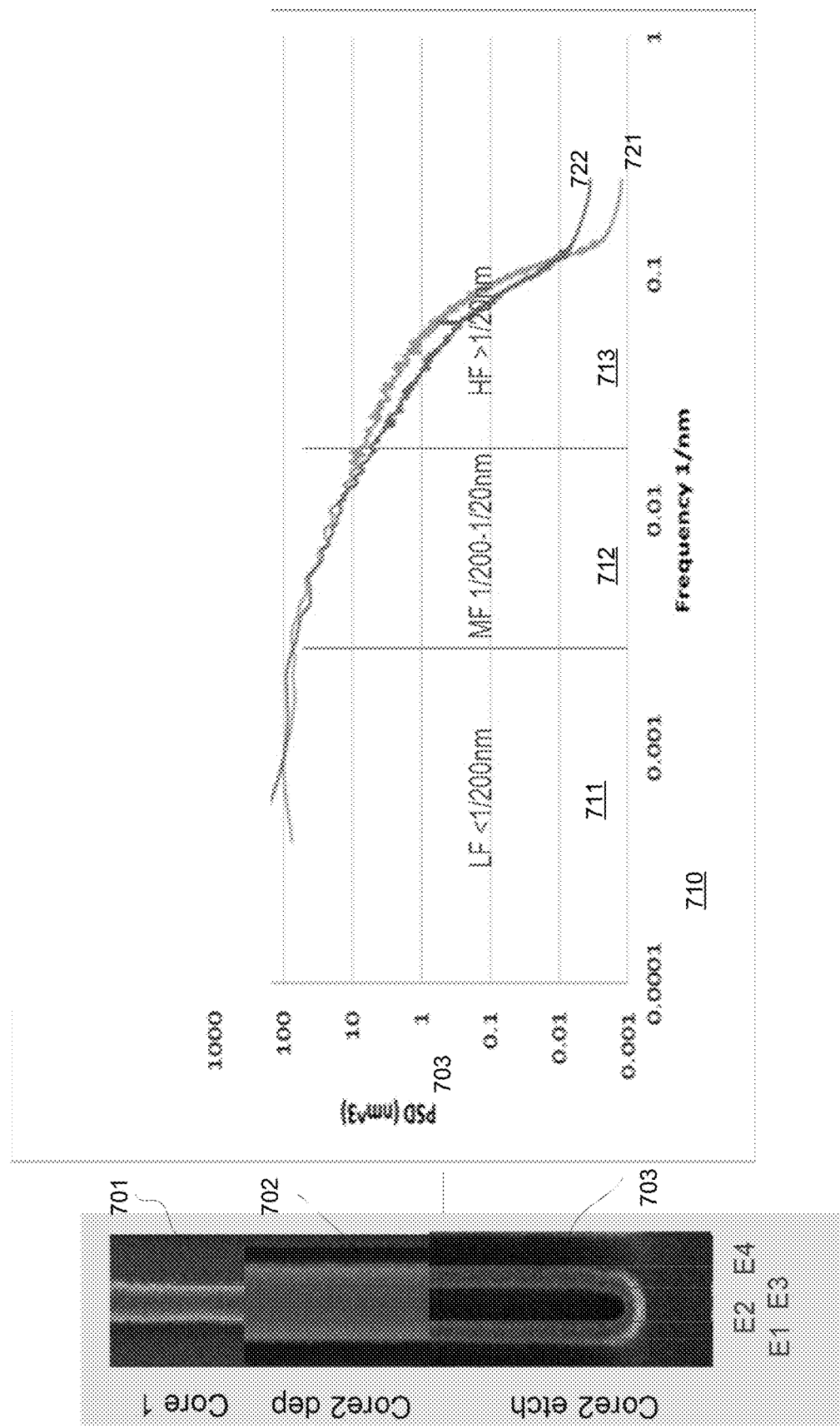
FIG. 20 illustrates examples of images and spatial spectrums.

FIG. 20 illustrates three SEM images 701, 702 and 703 of a region of an object that includes an edge—obtained during three different manufacturing phases—Core 1, Core2 dep and Core2 etch.

Core2 follows core 1 and includes a deposition of material. Core2 etch follows Core2 dep and involves removing material.

Especially—Core1 involves creating a mandrel. Core2 dep includes depositing a spacer on the mandrel. Core2 etch includes exposing spacer portions on the sides of the mandrel while removing spacer portions that were on top of the mandrel.

Lines E1, E2, E3 and E4 represent four ideal lines.

It is assumed that multiple edge measurements (indicative of locations of edge pixels) are obtained for each one of the three manufacturing phases.

FIG. 20 also illustrates a graph 710 that illustrates a spatial spectrum 721 of multiple edge measurements obtained for Core2 etch and a spatial spectrum 722 of multiple edge measurements obtained for Core1.

The spectrum is divided to three bands—low band 711, medium band 712 and high band 713. The number of bands may be two or above three and other bands may be defined.

Merely by way of example, differences within low band 711, between spatial spectrums 721 and 722, may affect yield and may be indicate of overlay errors. This is one example of a manufacturing process defect. Relationships between the spatial spectrums within a particular band, or between different bands, can be indicative of manufacturing process defects.

As another example, differences within medium band 712, between spatial spectrums 721 and 722, may affect gate performance (leakage) and may be amended by adjusting pulsing and conductance knobs. This is an example of another manufacturing process defect.

As one more example, differences within high band 713, between spatial spectrums 721 and 722, may affect gate performance (leakage) and may be amended by adjusting treatment knobs. This example uses the same manufacturing process defect (gate performance), but adjustment knobs are different within this band.

It should be noted that the number of bands may differ from three (two, four, five, six, seven, eight and above eight), the one or more bands may of the the same width and/or that two or more bands may differ from each other by their width.

The bands and/or the manner in which the spectrum within the bands are compared may be defined based on a relationship between different manufacturing process parameters and/or manufacturing process defects.

The different process parameters may include a temperature, a radiation wavelength, a radiation intensity, a duration of a process manufacturing phase, an angle of illumination, a width of a radiation beam, a chemical compound, a plasma parameter, an etching parameter, a deposition parameter, and the like.

The bands may be defined so that different bands correspond to different manufacturing process defects.

When a manufacturing process defect has a spectral signature, the comparison is defined to detect that spectral signature.

A relationship between spectrums of edges and values of manufacturing process parameters may be learned over time, may be estimated, may be determine using artificial intelligence or machine learning, may be provide by a third party, and the like.

The allocation of bands and/or the comparison between the spectrums and/or bands may be changed over time.

Figure 21:
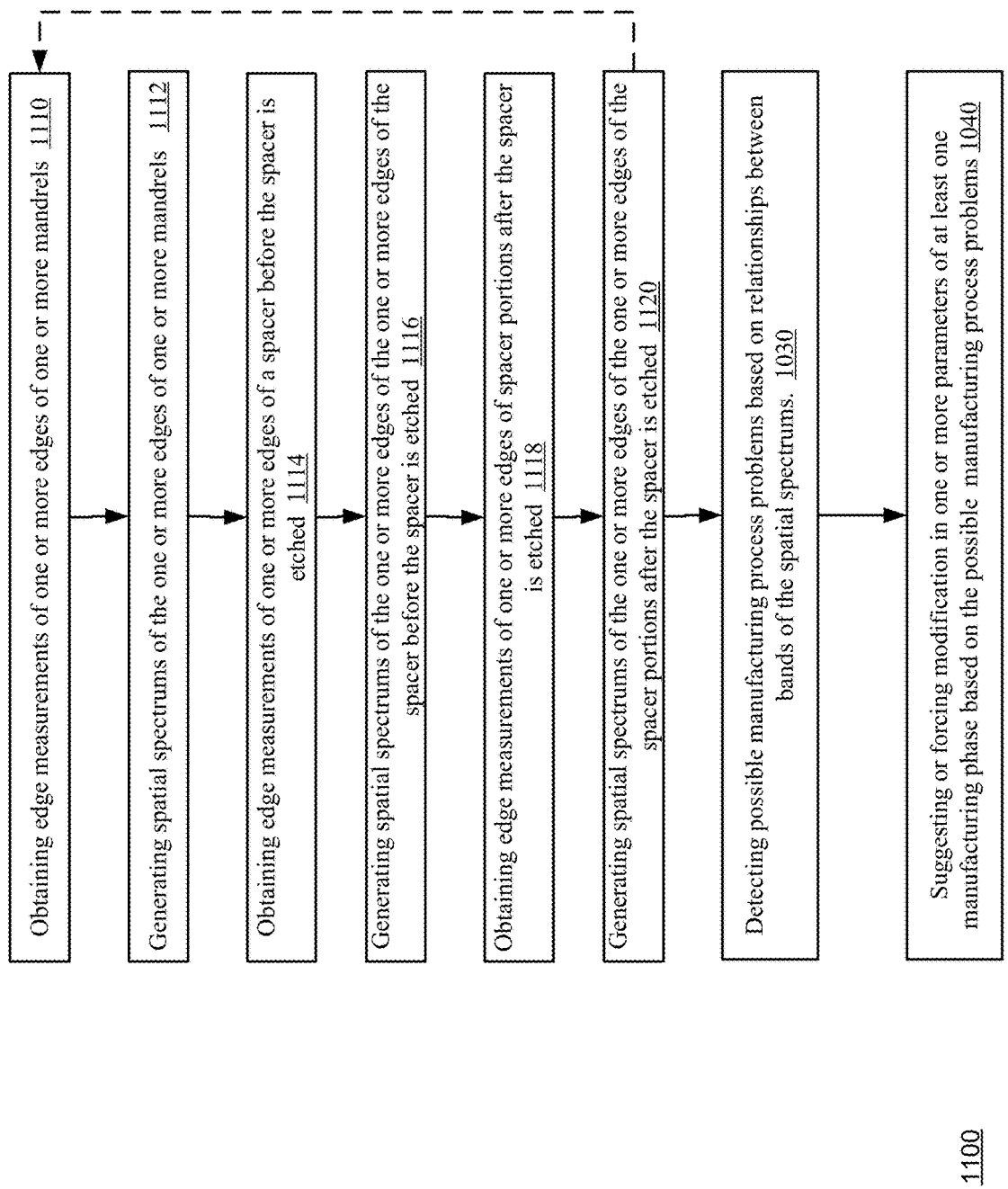
FIG. 21 illustrates an example of a method.

FIG. 21 illustrates an example of method 1100.

Method 1100 may include a sequence of steps 1110, 1112, 1114, 1116, 1118, 1120, 1030 and 1040. Step 1120 may be followed by step 1110—in a multiple patterning process that includes more phases than a double patterning process.

Step 1110 may include obtaining multiple edge measurements of one or more edges of one or more mandrels.

Step 1112 may include generating multiple spatial spectrums for one or more edges of one or more mandrels. Step 1112 may include applying a spatial frequency transform on the multiple edge measurements obtained during step 1110.

Step 1114 may include obtaining multiple edge measurements of one or more edges of a spacer. The spacer is deposited on the one or more mandrels.

Step 1116 may include generating multiple spatial spectrums for one or more edges of the spacer. Step 1116 may include applying a spatial frequency transform on the multiple edge measurements obtained during step 1114.

Step 1118 may include obtaining multiple edge measurements of one or more edges of spacer portions after the spacer is etched.

Step 1120 may include generating multiple spatial spectrums for one or more edges of spacer portions after the spacer is etched. Step 1120 may include applying a spatial frequency transform on the multiple edge measurements obtained during step 1118.

Step 1030 may include detecting possible manufacturing process problems based on relationships between spatial spectrums. The relationships may be determined using a spatial frequency-based comparison. For example—the relationships may be made per spatial frequency band.

Step 1040 may include suggesting (or forcing) modification in one or more manufacturing process parameters based on the possible manufacturing process problems. Step 1040 may include suggesting (or forcing) modifying manufacturing process parameters of various knobs such as lithography, etch, deposition, CMP, Epi and the like.

Figure 22:
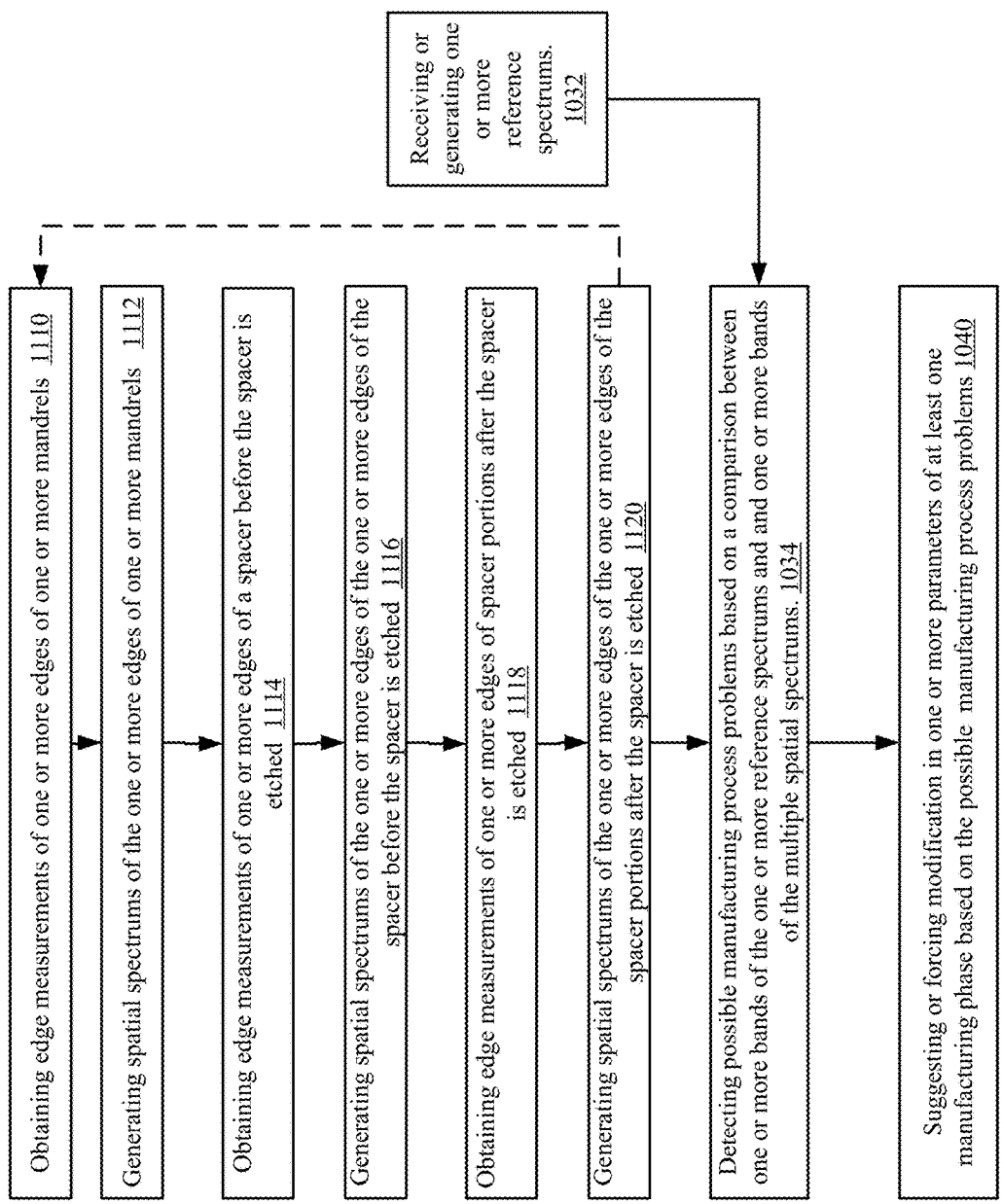
FIG. 22 illustrates an example of a method.

FIG. 22 illustrates an example of method 1103.

Method 1103 may include step 1032 and a sequence of steps 1010, 1020, 1034 and 1040. Step 1032 may be followed by step 1034.

Step 1120 may be followed by step 1110—in a multiple patterning process that include more phases than a double patterning process.

Step 1110 may include obtaining multiple edge measurements of one or more edges of one or more mandrels.

Step 1112 may include generating multiple spatial spectrums for one or more edges of one or more mandrels. Step 1112 may include applying a spatial frequency transform on the multiple edge measurements obtained during step 1110.

Step 1114 may include obtaining multiple edge measurements of one or more edges of a spacer. The spacer is deposited on the one or more mandrels.

Step 1116 may include generating multiple spatial spectrums for one or more edges of the spacer. Step 1116 may include applying a spatial frequency transform on the multiple edge measurements obtained during step 1114.

Step 1118 may include obtaining multiple edge measurements of one or more edges of spacer portions after the spacer is etched.

Step 1120 may include generating multiple spatial spectrums for one or more edges of spacer portions after the spacer is etched. Step 1120 may include applying a spatial frequency transform on the multiple edge measurements obtained during step 1118.

Step 1032 may include receiving or generating one or more reference spectrums. Each reference spectrum may be generated in any manner—it may reflect actual spectrums of devices of ideal or acceptable edge roughness, it may be generated based on computer aided design files, it may be generated based on both actual spectrums and simulated (or otherwise calculated) spectrums, and the like.

Step 1034 may include detecting possible manufacturing process problems based on a comparison between one or more bands of the one or more reference spectrums and one or more bands of the multiple spatial spectrums.

Step 1040 may include suggesting (or forcing) modification in one or more manufacturing process parameters based on the possible manufacturing process problems. Step 1040 may include suggesting (or forcing) modifying manufacturing process parameters of various knobs such as lithography, etch, deposition, CMP, Epi and the like.

Figure 23:
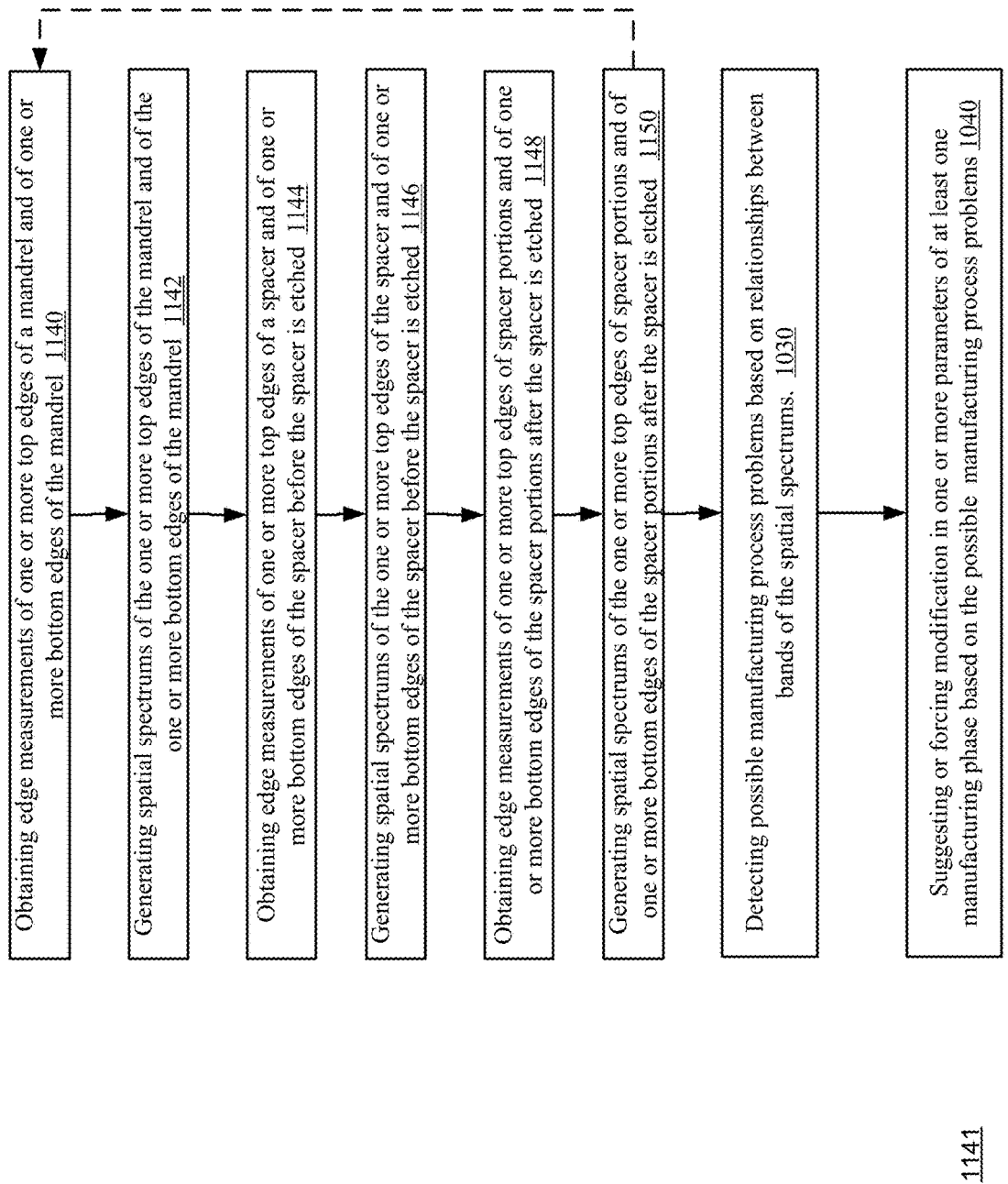
FIG. 23 illustrates an example of a method.

FIG. 23 illustrates an example of method 1141.

Method 1141 may include a sequence of steps 1140, 1142, 1144, 1146, 1148, 1150, 1030 and 1040. Step 1150 may be followed by step 1140—in a multiple patterning process that include more phases than a double patterning process.

Step 1140 may include obtaining multiple edge measurements of one or more top edges of a mandrel and of one or more bottom edges of a mandrel.

Step 1142 may include generating multiple spatial spectrums for one or more top edges of a mandrel and one or more bottom edges of a mandrel. Step 1142 may include applying a spatial frequency transform on the multiple edge measurements obtained during step 1140.

Step 1144 may include obtaining multiple edge measurements of one or more top edges of a spacer and one or more bottom edges of the spacer. The spacer is deposited on the one or more mandrels.

Step 1146 may include generating multiple spatial spectrums for the one or more top edges of the spacer and one or more bottom edges of the spacer. Step 1146 may include applying a spatial frequency transform on the multiple edge measurements obtained during step 1144.

Step 1148 may include obtaining multiple edge measurements of one or more top edges of spacer portions and one or more bottom edges of the spacer portions after the spacer is etched.

Step 1150 may include generating multiple spatial spectrums for one or more top edges of spacer portions and one or more bottom edges of the spacer portions after the spacer is etched. Step 1150 may include applying a spatial frequency transform on the multiple edge measurements obtained during step 1148.

Step 1030 may include detecting possible manufacturing process problems based on relationships between spatial spectrums. The relationships may be determined using a spatial frequency-based comparison. For example—the relationships may be made per spatial frequency band.

Step 1040 may include suggesting (or forcing) modification in one or more manufacturing process parameters based on the possible manufacturing process problems. Step 1040 may include suggesting (or forcing) modifying manufacturing process parameters of various knobs such as lithography, etch, deposition, CMP, Epi and the like.

Although method 1141 refers to edges of a mandrel—method 1141 may include obtaining one or more top edges and one or more bottom edges of one or more mandrels. Method 1411 may include obtaining one or more top edges and one or more bottom edges of one or more spacer portions related to multiple mandrels.

Figure 24:
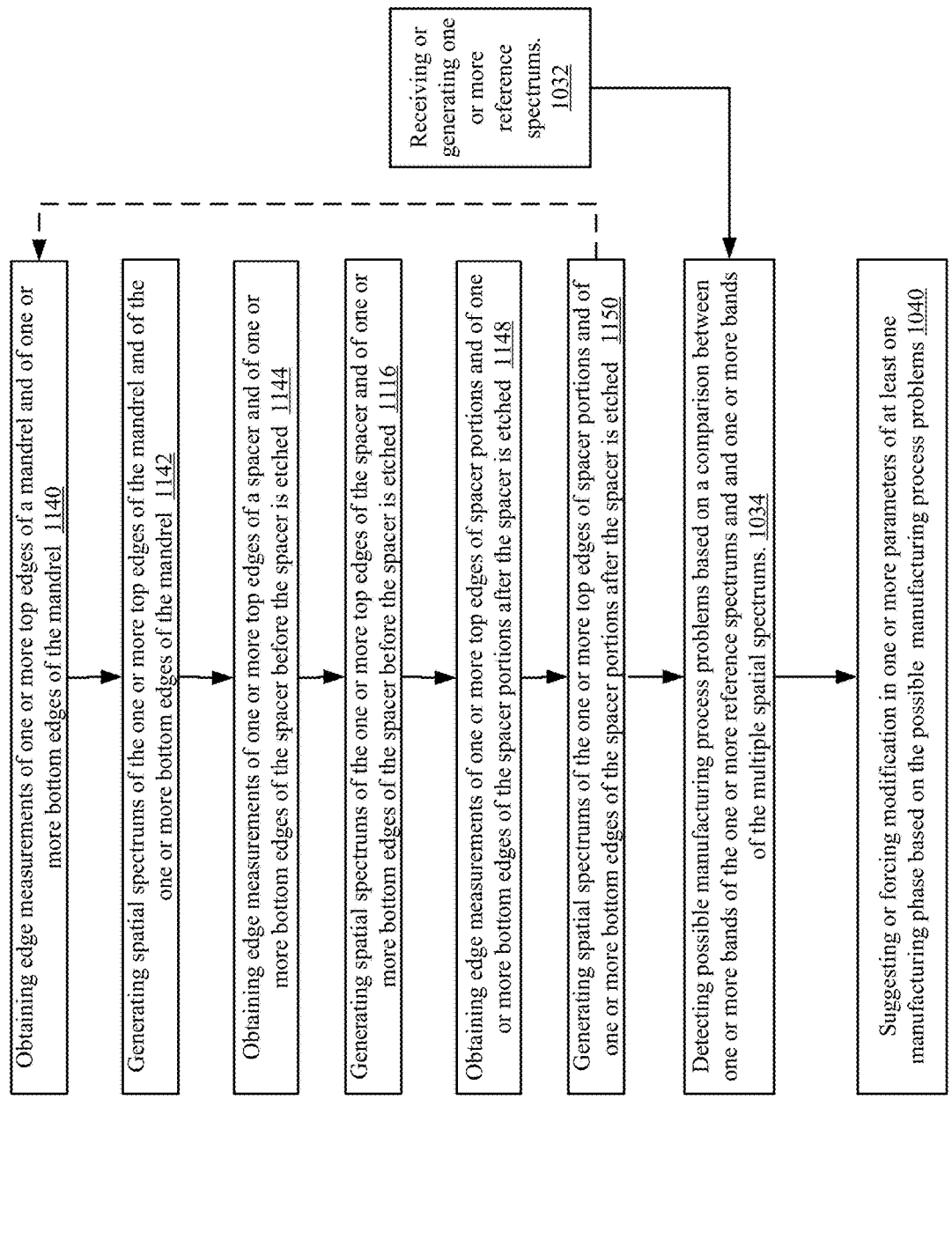
FIG. 24 illustrates an example of a method.

FIG. 24 illustrates an example of method 1160.

Method 1160 may include step 1032 and a sequence of steps 1140, 1150, 1034 and 1040. Step 1032 may be followed by step 1034.

Step 1140 may include obtaining multiple edge measurements of one or more top edges of a mandrel and one or more bottom edges of a mandrel.

Step 1142 may include generating multiple spatial spectrums for one or more top edges of a mandrel and one or more bottom edges of a mandrel. Step 1142 may include applying a spatial frequency transform on the multiple edge measurements obtained during step 1140.

Step 1144 may include obtaining multiple edge measurements of one or more top edges of a spacer and one or more bottom edges of the spacer. The spacer is deposited on the one or more mandrels.

Step 1146 may include generating multiple spatial spectrums for the one or more top edges of the spacer and one or more bottom edges of the spacer. Step 1146 may include applying a spatial frequency transform on the multiple edge measurements obtained during step 1144.

Step 1148 may include obtaining multiple edge measurements of one or more top edges of spacer portions and one or more bottom edges of the spacer portions after the spacer is etched.

Step 1150 may include generating multiple spatial spectrums for one or more top edges of spacer portions and one or more bottom edges of the spacer portions after the spacer is etched. Step 1150 may include applying a spatial frequency transform on the multiple edge measurements obtained during step 1148.

Step 1032 may include receiving or generating one or more reference spectrums. Each reference spectrum may be generated in any manner—it may reflect actual spectrums of devices of ideal or acceptable edge roughness, it may be generated based on computer aided design files, it may be generated based on both actual spectrums and simulated (or otherwise calculated) spectrums, and the like.

Step 1034 may include detecting possible manufacturing process problems based on a comparison between one or more bands of the one or more reference spectrums and and one or more bands of the multiple spatial spectrums.

Step 1040 may include suggesting (or forcing) modification in one or more manufacturing process parameters based on the possible manufacturing process problems. Step 1040 may include suggesting (or forcing) modifying manufacturing process parameters of various knobs such as lithography, etch, deposition, CMP, Epi and the like.

Although method 1160 refers to edges of a mandrel—method 1160 may include obtaining one or more top edges and one or more bottom edges of one or more mandrels. Method 1160 may include obtaining one or more top edges and one or more bottom edges of one or more spacer portions related to multiple mandrels.

Figure 25:
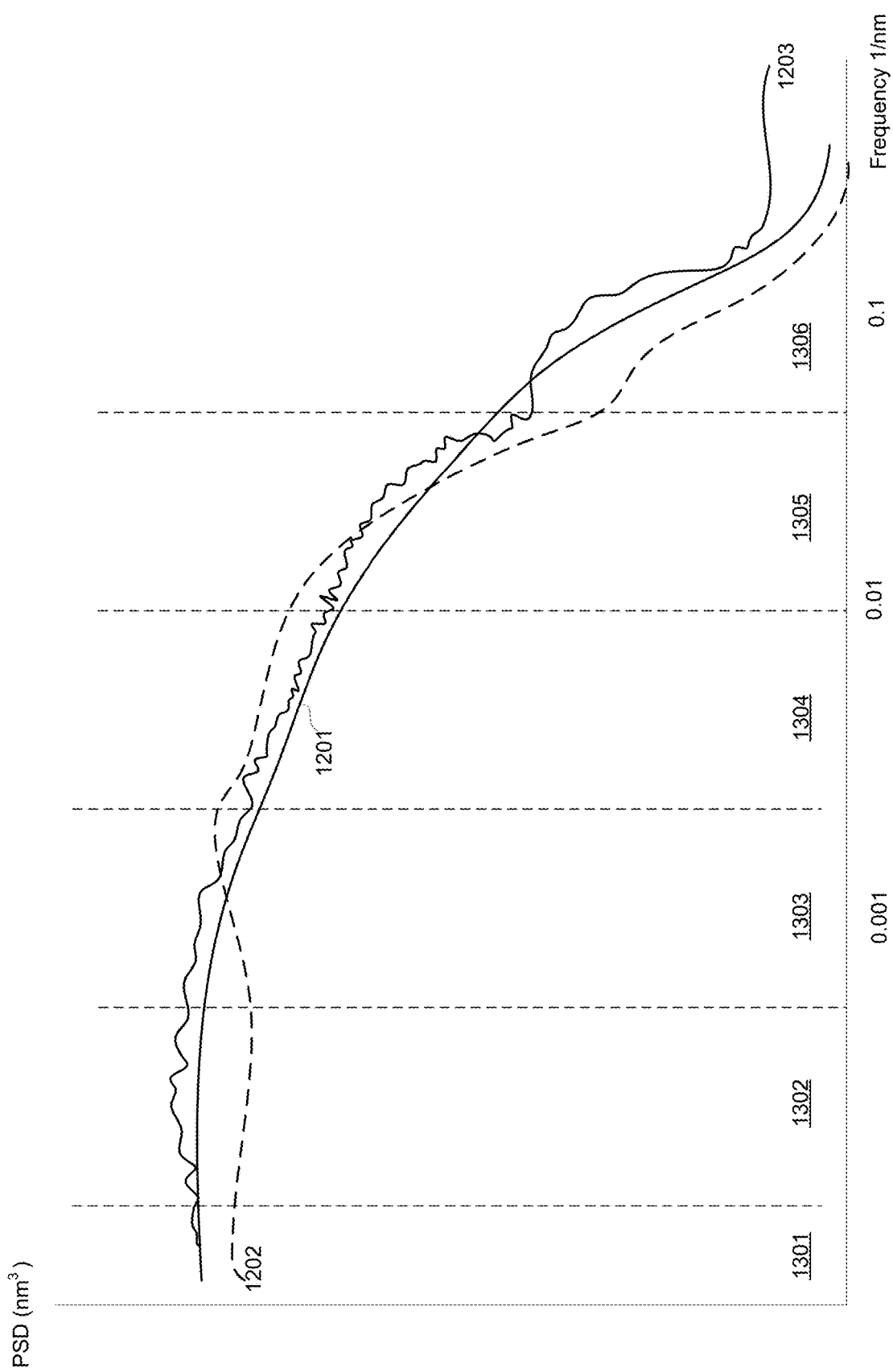
FIG. 25 illustrates examples of spatial spectrums.
Figure 26:
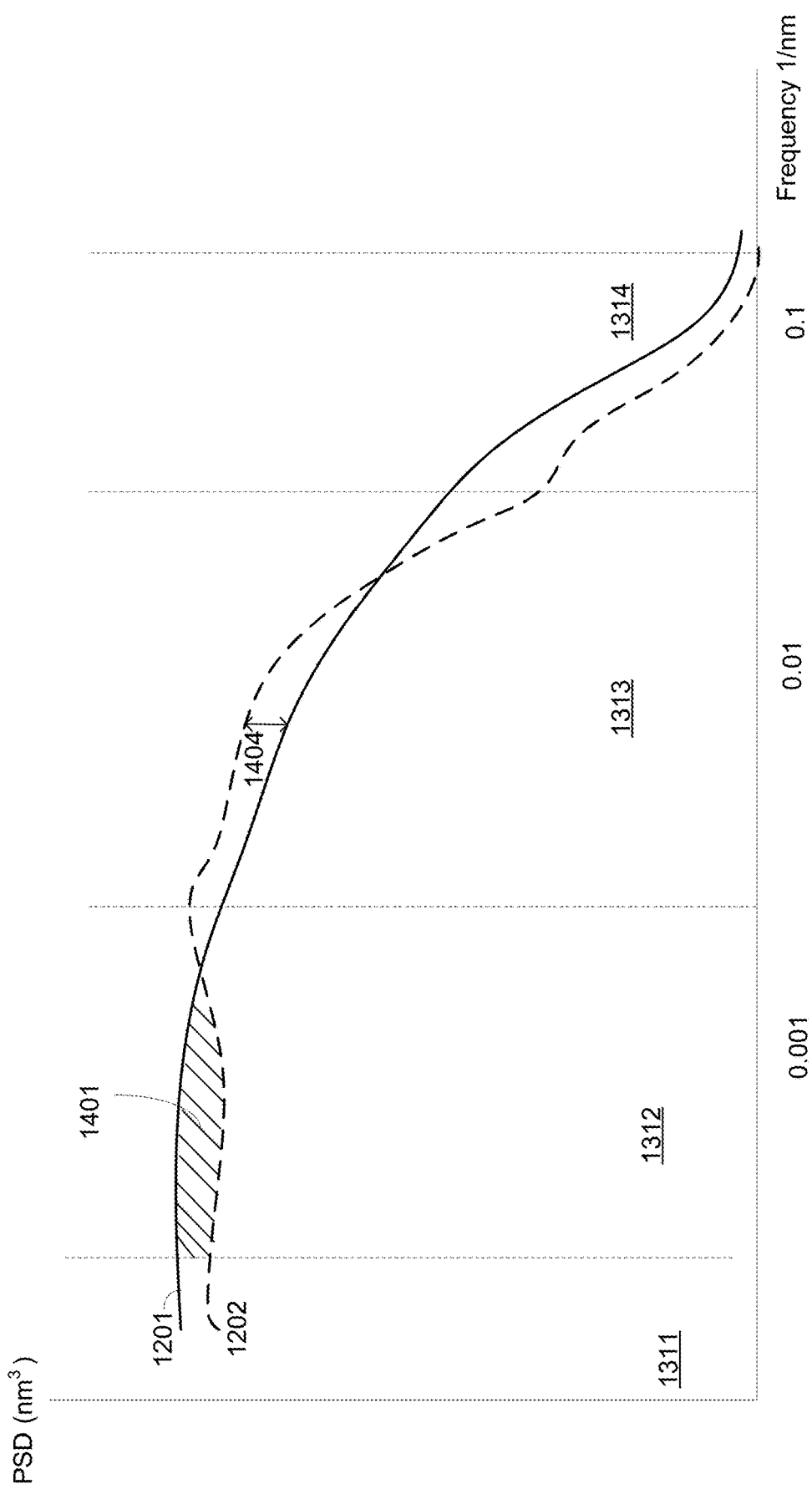
FIG. 26 illustrates examples of spatial spectrums.
Figure 27:
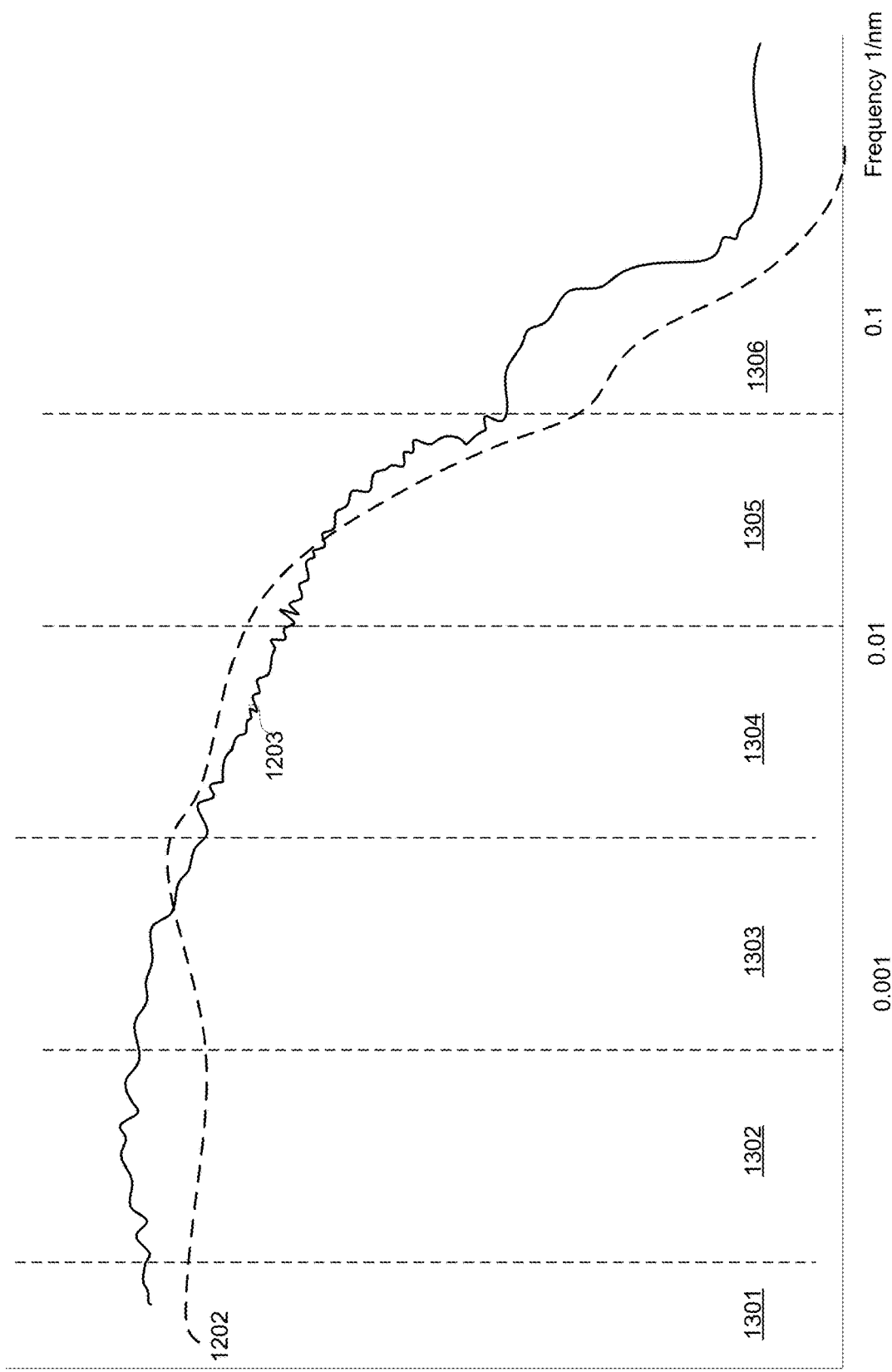
FIG. 27 illustrates examples of spatial spectrums.

FIG. 25 illustrates spatial spectrums 1201, 1202 and 1203. FIG. 26 illustrates spatial spectrums 1201 and 1202, and FIG. 27 illustrates spatial spectrums 1203 and 1202.

Each one of spatial spectrums 1201, 1202 and 1203 may be a reference spatial spectrum or a measured spatial spectrum.

At least two different spatial spectrums may be obtained during two different manufacturing phases of related structural elements.

Each one of the spectral spectrums may be indicative of a roughness of a top edge or a roughness of a bottom edge.

FIGS. 25 and 27 illustrates bands 1301, 1302, 1303, 1304 1305 and 1306. FIG. 26 illustrates bands 1311, 1312, 1313 and 1314.

A comparison between two or more of the spatial spectrums 1201, 1202 and 1203 within one or more bands can be indicative of defects and/or or values of manufacturing process parameters.

For example—referring to FIG. 25—in bands 1304 and 1305 spatial spectrum 1203 is less smooth than spatial spectrums 1201 and 1202. Yet for another example—in band 1306 the spatial spectrum 1202 is below spatial spectrum 1203.

Yet for another example—in FIG. 26 the area 1401 between spatial spectrum 1201 and 1202 may exceed a predefined area threshold. In region 1313 a maximal height difference 1404 between the spatial spectrum 1201 and 1202 may be below a predefined height threshold.

Figure 28:
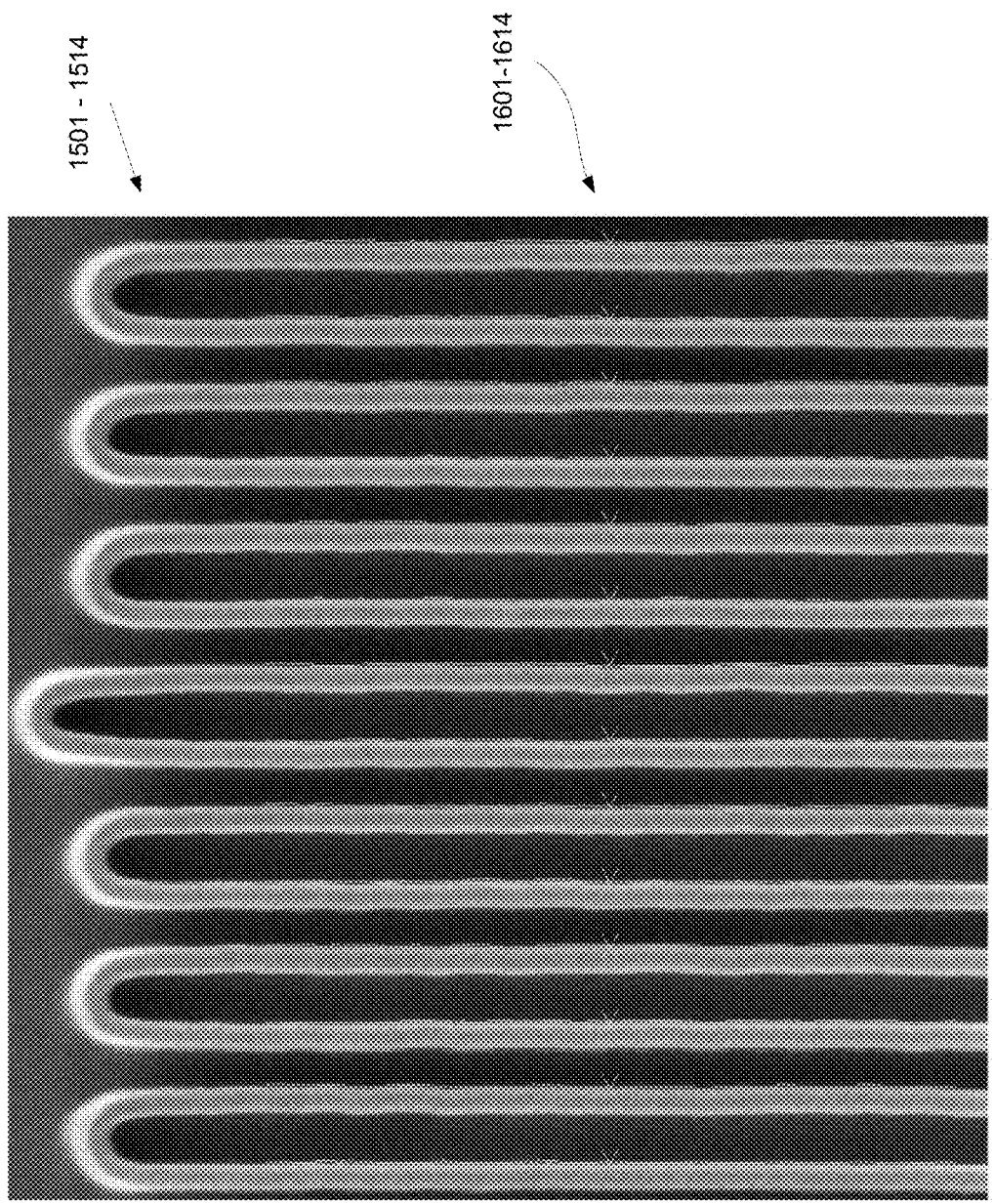
FIG. 28 illustrates an image of spacer elements.

FIG. 28 includes a top image 1500 of fourteen spacer elements 1501-1514 and fourteen top edges 1601-1614 of the fourteen spacer elements that had their roughness measured.

Figure 29:
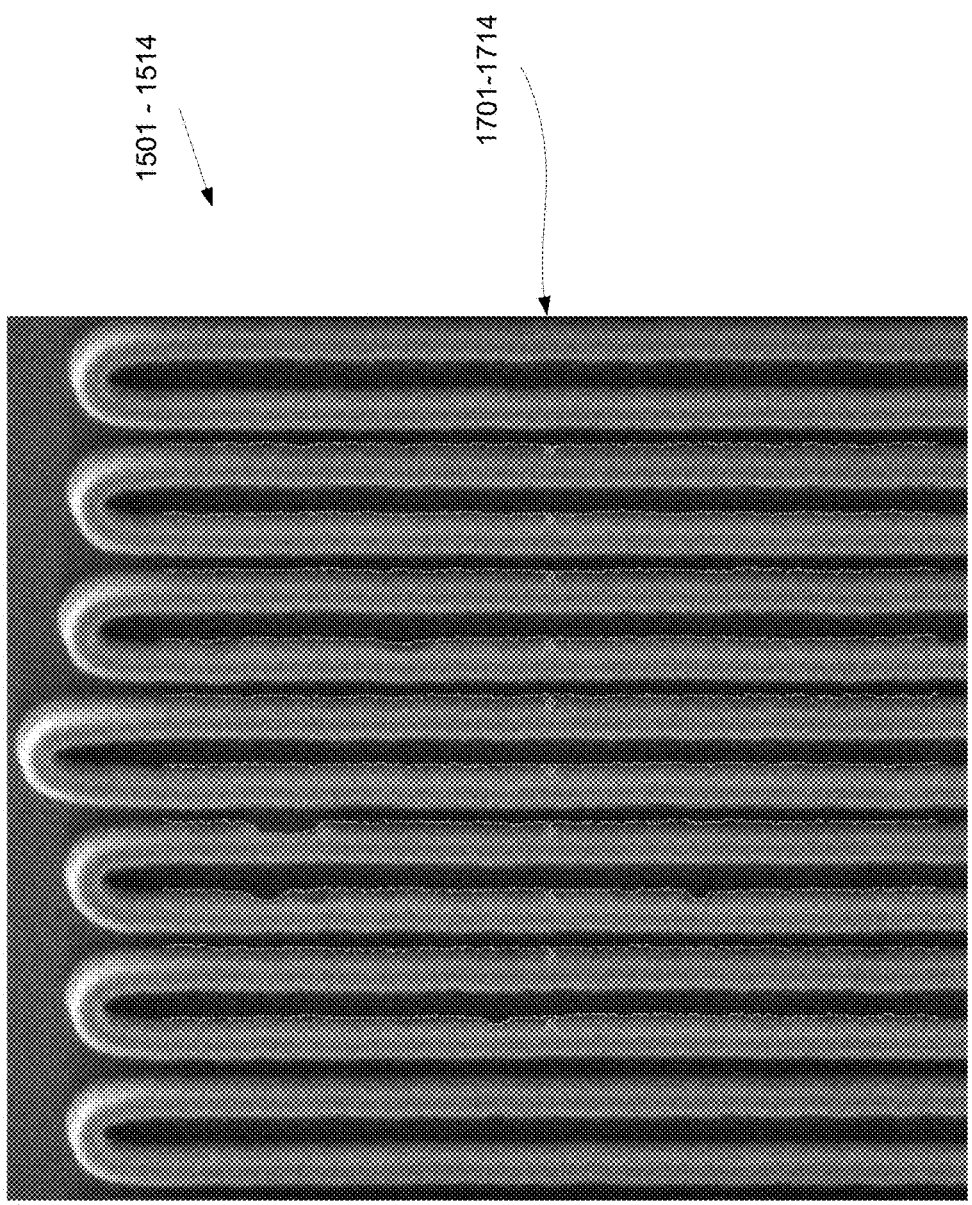
FIG. 29 illustrates an image of spacer elements.

FIG. 29 includes a tilted image 1700 of the fourteen spacer elements 1501-1514 and fourteen bottom edges 1701-1714 of the fourteen spacer elements that had their roughness measured.

Each pair of spacer elements are coupled to each other and form a structural element that has an interior. The interior is located where the mandrel was positioned. Edges of a spacer element that are formed on the interior of the structural element are referred to as core edges and edges that are formed on the exterior of the structural element are referred to as gap edges.

Figure 30:
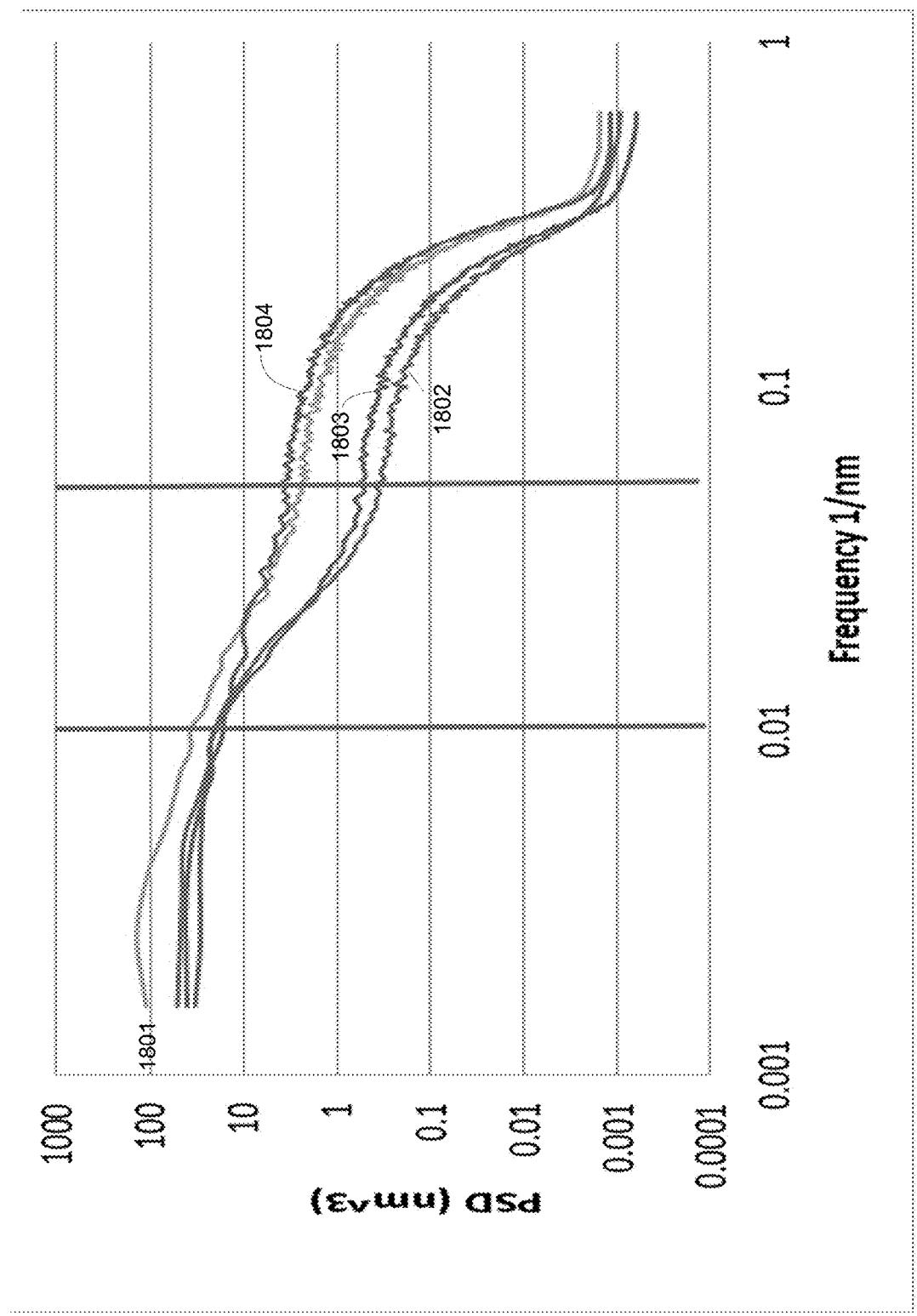
FIG. 30 illustrates examples of spatial spectrums.

FIG. 30 includes spatial spectrums 1801, 1802, 1803 and 1804.

Spatial spectrum 1801 represents the edge roughness of a bottom core edge.

Spatial spectrum 1802 represents the edge roughness of a top core edge.

Spatial spectrum 1803 represents the edge roughness of a top gap edge.

Spatial spectrum 1804 represents the edge roughness of a bottom gap edge.

Any comparison between spatial spectrums (per the three bands of FIG. 30) may be done.

For example—it can be seen that the leftmost part of spectral spectrums 1801 and 1802 there is a substantial different between the PSD (about 100 versus sixty).

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for detecting manufacturing process defects, the method comprising:
   obtaining multiple edge measurements of one or more structural elements after a completion of each one out of multiple manufacturing phases, the multiple edge measurements including at least one of critical dimension (CD) measurements, edge roughness measurements, or overlay measurements;
   generating spatial spectrums, based on the multiple edge measurements, for each one of the multiple manufacturing phases;
   segmenting each of the spatial spectrums to define multiple bands;
   determining relationships between the spatial spectrums within each of the multiple bands using a spatial frequency-based comparison; and
   identifying at least one of the manufacturing process defects based on the relationships between the spatial spectrums in at least one of the multiple bands.

2. The method according to claim 1 wherein the obtaining of the multiple edge measurements comprises irradiating, by a charged particle metrology tool, edges of the one or more structural elements.

3. The method according to claim 1 wherein the obtaining of the multiple edge measurements comprise obtaining tilted images of the one or more structural elements.

4. The method according to claim 1 wherein the obtaining of the multiple edge measurements comprising obtaining bottom edge measurements and top edge measurements of the structural elements.

5. The method according to claim 1 further comprising forcing a modification of one or more manufacturing process parameters when finding the at least one of the manufacturing process defects.

6. The method according to claim 1 further comprising receiving or generating one or more reference spatial spectrums, and determining relationships between the spatial spectrums and the one or more reference spatial spectrums within each of the multiple bands.

7. The method according to claim 1 wherein the one or more structural elements comprise a mandrel, a spacer, spacer elements and intermediate layer elements that are formed by applying a etch process on the spacer elements.

8. A non-transitory computer program product that stores instructions that when executed by a processor causes a defect detection system to perform steps comprising:
   obtaining multiple edge measurements of one or more structural elements after a completion of each one of multiple manufacturing phases;
   generating spatial spectrums, based on the multiple edge measurements, for each one of the multiple manufacturing phases;
   segmenting each of the spatial spectrums to define multiple bands;
   determining relationships between the spatial spectrums within each of the multiple bands using a spatial frequency-based comparison; and
   identifying at least one manufacturing process defect based on the relationships between the spatial spectrums in at least one of the multiple bands.

9. The non-transitory computer program product according to claim 8 wherein the obtaining of the multiple edge measurements comprises:
   irradiating, by a charged particle metrology tool, edges of the one or more structural elements, obtaining tilted images of the one or more structural elements, and/or obtaining bottom edge measurements and top edge measurements of the structural elements.

10. The non-transitory computer program product according to claim 8 further comprising instructions for forcing a modification of one or more manufacturing process parameters when finding the at least one of the manufacturing process defects.

11. The non-transitory computer program product according to claim 8 further comprising instructions for receiving or generating one or more reference spatial spectrums, and determining relationships between the spatial spectrums and bands of the one or more reference spatial spectrums within each of the multiple bands.

12. The non-transitory computer program product according to claim 8 wherein the one or more structural elements comprise a mandrel, a spacer, spacer elements and intermediate layer elements that are formed by applying a etch process on the spacer elements.

13. A system that comprises a processor and a memory unit, wherein the memory unit is constructed and arranged to store multiple edge measurements of one or more structural elements after a completion of each one out of multiple manufacturing phases, the multiple edge measurements including at least one of critical dimension (CD) measurements, edge roughness measurements, or overlay measurements; wherein the processor is constructed and arranged to (a) generate spatial spectrums, based on the multiple edge measurements, for each one of the multiple manufacturing phases; (b) segmenting each of the spatial spectrums to define multiple bands; (c) determine relationships between the spatial spectrums within each of the multiple bands using a spatial frequency-based comparison; and (d) identify at least one manufacturing process defect based on the relationships between the spatial spectrums in at least one of the multiple bands.

\* \* \* \* \*